(12) United States Patent
Kobayashi et al.

(10) Patent No.: US 6,838,643 B2
(45) Date of Patent: Jan. 4, 2005

(54) METHOD AND APPARATUS FOR PERFORMING BAKING TREATMENT TO SEMICONDUCTOR WAFER

(75) Inventors: Shouzou Kobayashi, Tokyo (JP); Takamitsu Furukawa, Tokyo (JP); Keisuke Tanaka, Tokyo (JP); Kouhei Shimoyama, Tokyo (JP); Akira Watanabe, Tokyo (JP); Tadashi Nishimuro, Tokyo (JP); Koki Muto, Tokyo (JP); Azusa Yanagisawa, Tokyo (JP); Katsuo Oshima, Tokyo (JP)

(73) Assignee: OKI Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 10/197,598

(22) Filed: Jul. 18, 2002

(65) Prior Publication Data

US 2003/0057198 A1 Mar. 27, 2003

(30) Foreign Application Priority Data

Sep. 25, 2001 (JP) ........................................ 2001-290970

(51) Int. Cl.[7] ................................................. F27B 5/14
(52) U.S. Cl. ........................ 219/390; 219/405; 219/411; 392/416; 392/418; 118/724; 118/725; 118/501
(58) Field of Search ................................. 219/390, 405, 219/411, 444.1, 449.1; 118/724, 725, 50.1; 392/416, 418

(56) References Cited

U.S. PATENT DOCUMENTS 6,033,474 A * 3/2000 Mita et al. ..................... 118/58
6,402,844 B1 * 6/2002 Harada et al. ............... 118/666

FOREIGN PATENT DOCUMENTS

JP 11-204402 7/1999

* cited by examiner

Primary Examiner—Shawntina Fuqua
(74) Attorney, Agent, or Firm—Rabin & Berdo, PC

(57) ABSTRACT

An apparatus for baking a semiconductor wafer having a resist pattern thereon includes a baking oven in which the semiconductor wafer is placed and heated, and a first hot plate which is provided in the baking oven to heat an entire bottom surface of the semiconductor wafer. The apparatus also includes a gas supply unit having a gas introducing path, through which the purge gas is introduced into the baking oven, and a gas exhaust path, through which the purge gas is exhausted out of the baking oven. A gas temperature controller controls a temperature of the purge gas in order that the purge gas flowing around a peripheral edge or outer portion of the wafer has a higher temperature than that around the center or inner portion of the wafer.

18 Claims, 30 Drawing Sheets

METHOD AND APPARATUS FOR PERFORMING BAKING TREATMENT TO SEMICONDUCTOR WAFER

CROSS REFERENCE TO RELATED APPLICATION

This application claims the priority of Application No. 2001-290970, filed Sep. 25, 2001 in Japan, the subject matter of which is incorporated herein by reference.

TECHNICAL FIELD OF THE INVENTION

This invention relates to method and apparatus for performing baking treatment to a semiconductor wafer.

BACKGROUND OF THE INVENTION

A baking process is carried out as one of photolithographic processes, used for fabricating semiconductor integrated circuits. In a baking process, a semiconductor wafer is baked by using a baking oven.

A resist layer formed on a semiconductor is exposed with KrF light and developed to form a pre-designed resist pattern. After that, a high-temperature baking treatment is carried out on the wafer. A hot-plate type of baking oven has been used. The bottom surface of a wafer, which is arranged in the oven, is heated by a hot plate, while a purge gas is supplied into the oven. During such a process, the resist pattern is shunk. A resist pattern having a width narrower than 0.10 µm can be formed.

According to the above-described baking process, a change rate of size of a resist pattern is does not occur equally on the entire surface of the wafer. That is, the resist pattern is more narrowed at the center or inner portion of the wafer than around the peripheral edge or outer portion of the wafer. As a result, ICs or LSIs formed on the wafer may have different quality.

OBJECTS OF THE INVENTION

Accordingly, an object of the present invention is to provide a method for baking a semiconductor wafer, in which a resist pattern is changed in size at a uniform rate on the wafer entirely.

Another object of the present invention is to provide a baking apparatus, in which a resist pattern can be baked with a change of size occurring at a uniform rate over the entire wafer.

Additional objects, advantages and novel features of the present invention will be set forth in part in the description that follows, and in part will become apparent to those skilled in the art upon examination of the following or may be learned by practice of the invention. The objects and advantages of the invention may be realized and attained by means of the instrumentalities and combinations particularly pointed out in the appended claims.

SUMMARY OF THE INVENTION

According to a first aspect of the present invention, an apparatus for baking a semiconductor wafer having a resist pattern thereon, includes: a baking oven in which the semiconductor wafer is placed and heated; a first hot plate which is provided in the baking oven to heat an entire bottom surface of the semiconductor wafer; a gas supply unit which comprises a gas introducing path, through which the purge gas is introduced into the baking oven, and a gas exhaust path, through which the purge gas is exhausted out of the baking oven; and a gas temperature controller which controls a temperature of the purge gas in order that the purge gas flowing around a peripheral edge or outer portion of the wafer has a higher temperature than that around the center or inner portion of the wafer.

According to a second aspect of the present invention, an apparatus for baking a semiconductor wafer having a resist pattern thereon, includes: a baking oven in which the semiconductor wafer is placed and heated; a first hot plate which is provided in the baking oven to heat an entire bottom surface of the semiconductor wafer; a gas supply unit which comprises a gas introducing path, through which the purge gas is introduced into the baking oven, and a gas exhaust path, through which the purge gas is exhausted out of the baking oven; and a plate temperature controller which controls a temperature of the first hot plate in order that the first hot plate has a higher temperature at peripheral edge of the semiconductor wafer than that around the center of the semiconductor wafer.

According to a third aspect of the present invention, a method for baking a semiconductor wafer having a resist pattern thereon, includes the steps of: setting the semiconductor wafer in a baking oven; heating an entire bottom surface of the semiconductor wafer using a first hot plate; supplying a purge gas onto an upper surface of the semiconductor wafer; and controlling a temperature of the purge gas in order that the purge gas flowing around a peripheral edge of the semiconductor wafer has a higher temperature than that flowing around the center of the wafer.

According to a fourth aspect of the present invention, a method for baking a semiconductor wafer having a resist pattern thereon, includes the steps of: setting the semiconductor wafer in a baking oven; heating an entire bottom surface of the semiconductor wafer using a first hot plate; supplying a purge gas onto an upper surface of the semiconductor wafer; and controlling a temperature of the first hot plate in order that first hot plate has a higher temperature at peripheral edge of the semiconductor wafer than that around the center of the semiconductor wafer.

DETAILED DISCLOSURE OF THE INVENTION

In the following detailed description of the preferred embodiments, reference is made to the accompanying drawings which form a part hereof, and in which is shown by way of illustration specific preferred embodiments in which the inventions may be practiced. These preferred embodiments are described in sufficient detail to enable those skilled in the art to practice the invention, and it is to be understood that other preferred embodiments may be utilized and that logical, mechanical and electrical changes may be made without departing from the spirit and scope of the present inventions. The following detailed description is, therefore, not to be taken in a limiting sense, and scope of the present inventions is defined only by the appended claims.

First Preferred Embodiment

Figure 1:
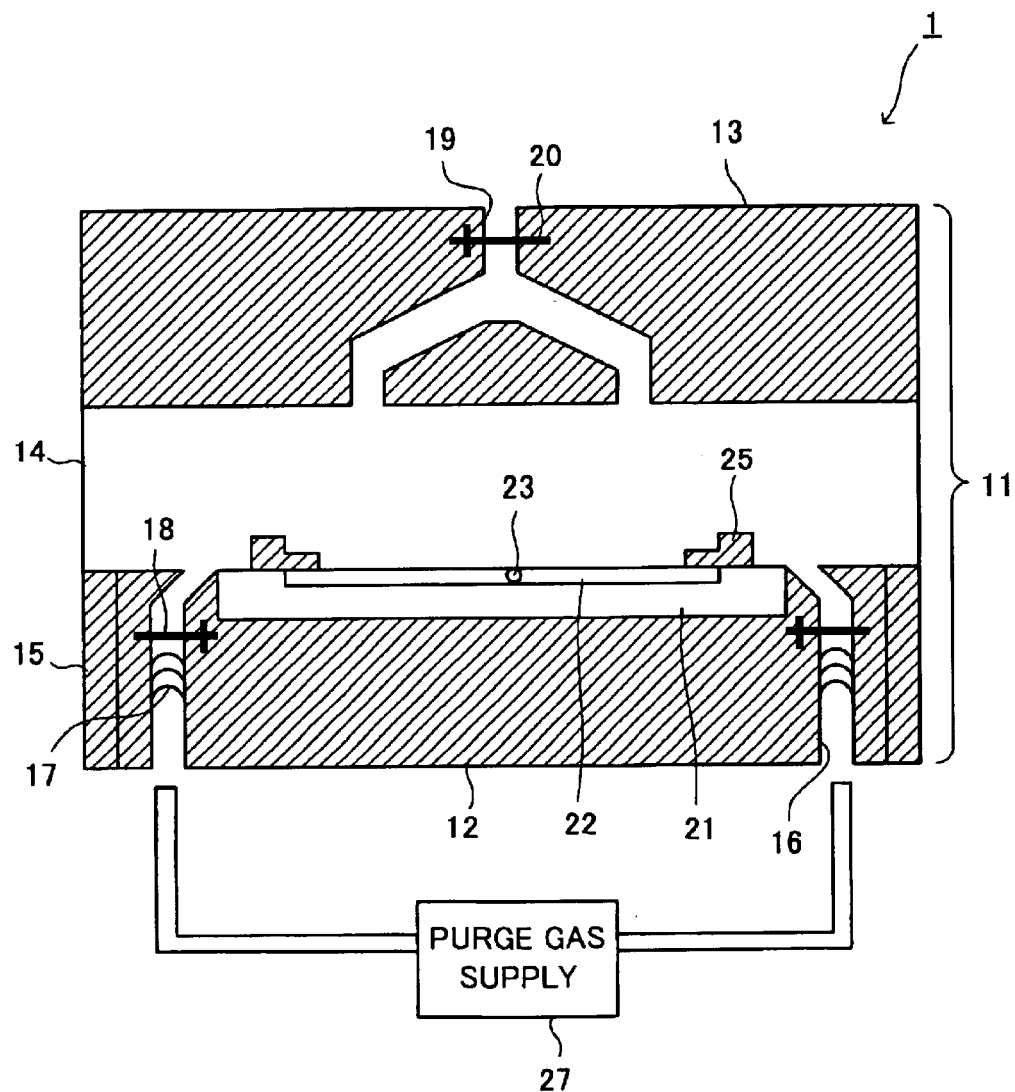
FIG. 1 is a cross-sectional view illustrating an apparatus for baking a semiconductor wafer according to a first preferred embodiment of the present invention.
Figure 2:
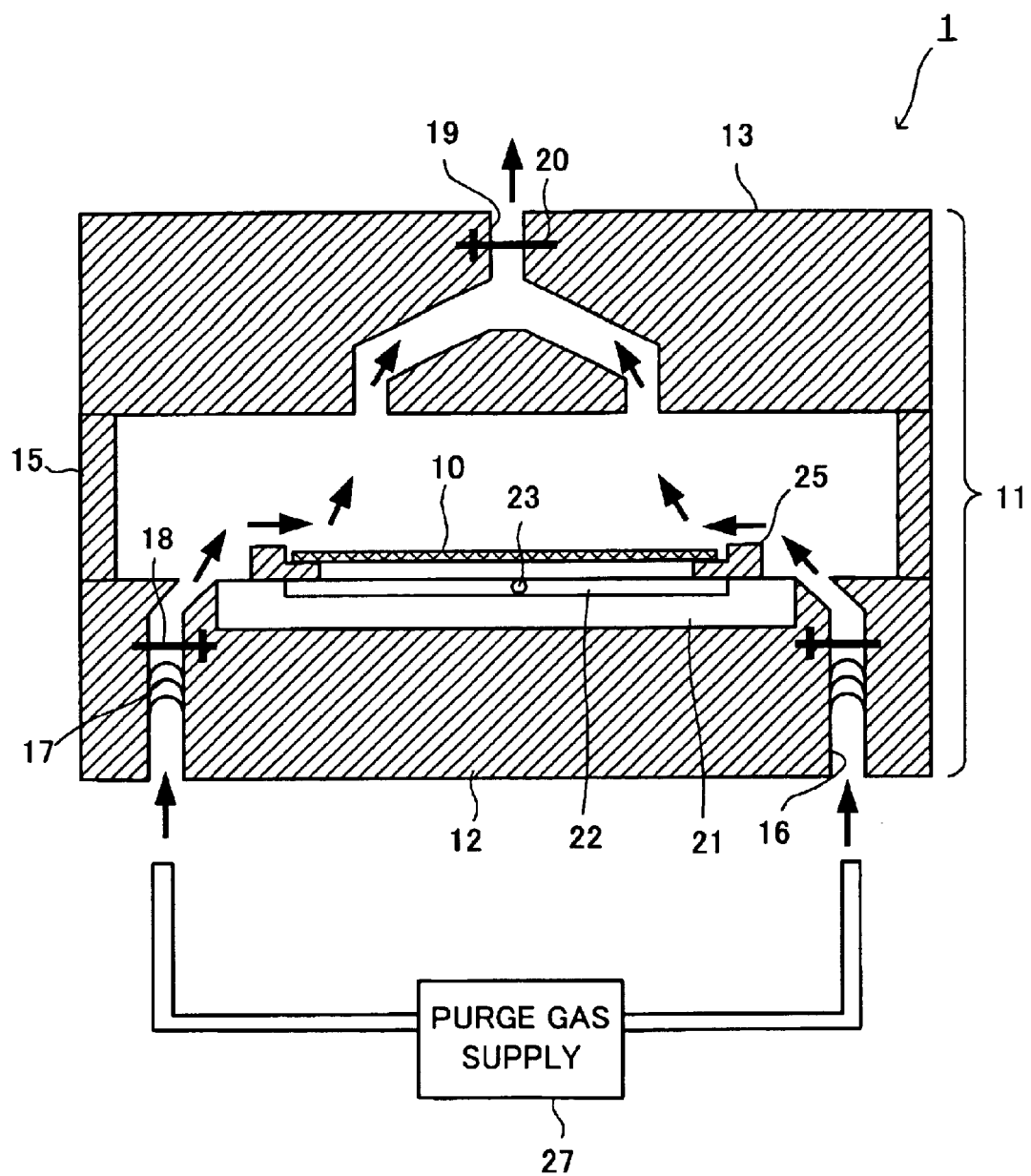
FIG. 2 is a cross-sectional view showing flow of a purge gas in a baking oven according to the first preferred embodiment, shown in FIG. 1.
Figure 3:
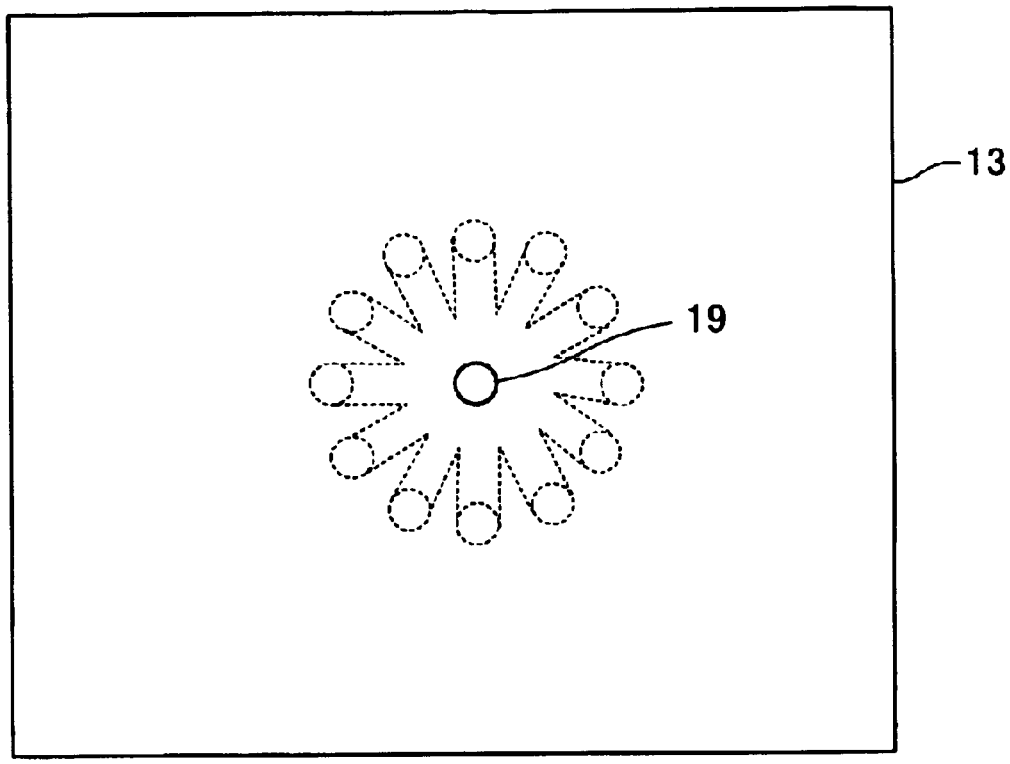
FIG. 3 is a plan view illustrating an upper cover of the baking oven according to the first preferred embodiment, shown in FIG. 1.

FIG. 1 is a cross-sectional view showing an apparatus 1 for baking a semiconductor wafer having a resist pattern thereon, according to a first preferred embodiment of the present invention. FIG. 2 is a cross-sectional view showing the apparatus 1 in a baking process. FIG. 3 is a plan view illustrating an upper cover 13 of the apparatus 1, FIG. 4 is a plan view illustrating a lower cover 12 of the apparatus 1, and FIG. 5 is a diagram showing a heating mechanism (hot plate 21) used in the apparatus 1.

As shown in FIGS. 1 and 2, the apparatus 1 includes a baking oven 11, in which a semiconductor wafer 10 having a resist pattern thereon is set. The baking oven 11 includes a lower cover 12 composing a lower portion of the baking oven 11 and an upper cover 13 composing an upper portion of the baking oven, and an inner-wall ring 15. The inner-wall ring 15 is designed to be able to rise and fall in order to open and close a wafer-introducing opening 14, which is arranged between the lower and upper covers 12 and 13. FIG. 1 shows the apparatus 1 in which the inner-wall ring 15 is at a lower position to open the wafer-introducing opening 14. FIG. 2 shows the apparatus 1 in which the inner-wall ring 15 is at a higher position to close the wafer-introducing opening 14.

Figure 4:
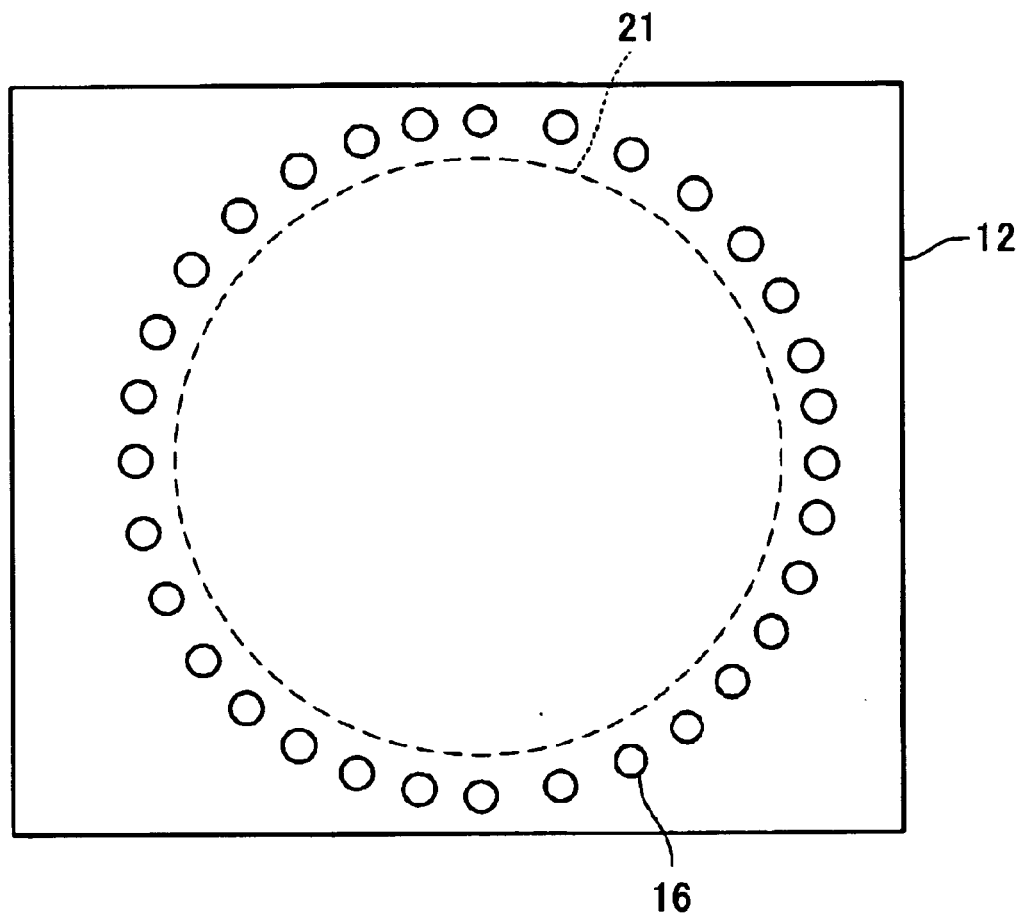
FIG. 4 is a plan view illustrating a lower cover of the baking oven according to the first preferred embodiment, shown in FIG. 1.
Figure 5:
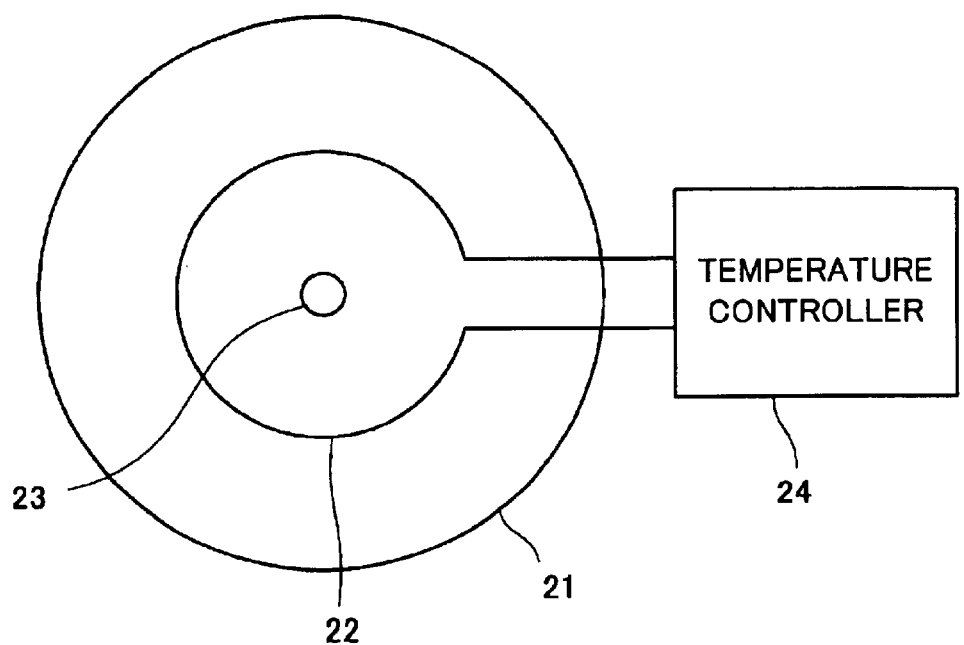
FIG. 5 is a diagram showing a heating mechanism used in the baking oven according to the first preferred embodiment, shown in FIG. 1.

As shown in FIGS. 1, 2 and 4, the lower cover 12 is provided with a plurality of gas-introducing paths 16, through which a purge gas is introduced into the baking oven 11. As shown in FIG. 4, the gas-introducing paths 16 are arranged to surround the peripheral edge of the semiconductor wafer 10 or a hot plate 21. The gas-introducing paths 16 are connected to a purge gas supply unit 27, which supplies a purge gas. The lower cover 12 is provided with gas heaters 17 in the gas-introducing paths 16 to heat the purge gas before it is introduced into the baking oven 11. The lower cover 12 is also provided with valves 18 to open and close the gas-introducing paths 16. The number, shape and arrangement of the gas-introducing paths 16 are not limited by this embodiment, as long as the purge gas is introduced from a region adjacent the peripheral edge of the semiconductor wafer 10 onto an upper surface of the wafer 10.

As shown in FIGS. 1, 2 and 3, the upper cover 13 is provided with a plurality of gas-exhaust paths 19, through which a purge gas is exhausted out of the baking oven 11. As shown in FIG. 3, the gas-exhaust paths 19 are arranged around the center of the baking oven 11, which faces the center of the semiconductor wafer 10. The gas-exhaust paths 19 are joined into one common path in the upper cover 13. The upper cover 13 is provided with valves 20 in the end of the gas-exhaust path 19 to open and close the gas-exhaust path 19. The number, shape and arrangement of the gas-exhaust paths 19 are not limited by this embodiment as long as the purge gas is exhausted from a region adjacent the center of the semiconductor wafer 10 out of the baking oven 11.

As shown in FIGS. 1 and 2, the apparatus 1 includes a hot plate 21 which heat a lower surface of the semiconductor wafer 10 entirely. As shown in FIGS. 1, 2 and 5, the hot plate 21 includes a wafer heater 22 and a temperature sensor 23. The apparatus 1 also includes a temperature controller 24 which control a voltage applied to the wafer heater 22 in accordance with an output signal from the temperature sensor 23. The hot plate 21 is provided with a wafer holder 25 to hold the semiconductor wafer 10 at a proper position.

In FIG. 5, although the heater 22 is shaped to be round, the shape is not limited by a round shape but can be other shapes as long as the heater 22 can heat the hot plate 21 entirely all over. In FIG. 5, the temperature sensor 23 is arranged at a center of the hot plate 21, however, the sensor 23 can be arranged at other portions.

The apparatus 1 may include a plurality of temperature sensors 23. If so, the temperature controller 24, for example, operates in accordance with the average value of sensing results of the plural sensors 23.

A resist pattern is formed using the above-described apparatus 1 as follows: First, a resist is coated on a semiconductor wafer 10, then the resist layer is exposed by a circuit pattern (for example, using KrF light). After that, the circuit pattern is developed to form a resist pattern. The semiconductor wafer 10 having such a formed resist pattern on it is introduced into the baking oven 11 from the wafer-introducing opening 14. The semiconductor wafer 10 is put on the wafer holder 25. Next, the inner-wall ring 15 is raised up to close the wafer-introducing opening 14 to form air-tightness in the baking oven 11. After that, a baking treatment is carried out on the semiconductor wafer 10 in the baking oven 11.

In a baking treatment, the semiconductor wafer 10 is heated by the heater 22 provided in the hot plate 21. The hot plate 21 and heater 22 are shaped and made of a material so as to heat an entire lower surface of the semiconductor wafer 10 uniformly. While the semiconductor wafer 10 is heated by the hot plate 21, a purge gas (for example, $N_2$ gas) is introduced through the gas-introducing paths 16 into the baking oven 11. The purge gas flows radially from an area adjacent the peripheral edge of the semiconductor wafer 10 toward an area adjacent the center of the wafer 10, and is exhausted through the gas-exhaust paths 19. The purge gas is heated by the heaters 17 in the gas-introducing paths 16 to have a temperature that is higher than that of the hot plate 21.

The optimum temperatures of the hot plate 21 and purge gas are determined based on measured data of the resist pattern after its baking treatment. That is because the optimum temperatures vary in response to many factors, including a shape and a size of the baking oven 11; a material and widths of the resist pattern on the wafer 10; a degree of heat-flow; the numbers, diameters, positions of the gas-introducing paths 16 and gas-exhaust paths 19; and a composition, a flow rate, and a flowing route of the purge gas. A voltage to be applied to the heaters 17 arranged in the gas-introducing paths 16 can be controlled in accordance with an output of the temperature sensor 23 or other sensors, which may be arranged adjacent the gas-introducing paths 16.

According to the apparatus 1, the gas-introducing paths 16 are arranged at regions adjacent the peripheral edge of the semiconductor wafer 10 in the lower cover 12; and the gas-exhaust paths 19 are arranged at regions adjacent the center of the semiconductor wafer 10 in the upper cover. Therefore, the purge gas is mainly flowing radially as shown by arrows in FIG. 2, from the peripheral edge to the center of the semiconductor wafer 10.

The temperature of the purge gas, which is heated before being introduced into the baking oven 11, is decreased gradually above the semiconductor wafer 10, and then is exhausted through the gas-exhaust paths 19. The temperature of the purge gas is higher at a region adjacent the peripheral edge of the semiconductor wafer in which the purge gas enters the baking oven 11 than at a region adjacent the center of the semiconductor wafer 10 where it exits the baking oven 11. The distribution or ranging of the temperature of the purge gas is gradual. As a result, the resist pattern formed at a region adjacent the peripheral edge of the wafer 10 may be changed in size (shrunken) more remarkably as compared to that by a conventional method. In other words, the resist pattern is changed in size at a uniform rate over the entire semiconductor wafer 10. Preferably, the outer region of the semiconductor wafer 10 has a temperature 1–2° higher than the inner region.

When the baking treatment is completed, the valves 18 and 20 are closed and the inner-wall ring 15 is moved to its lower position. After that, the semiconductor wafer 10 is taken out from the wafer-introducing opening 14.

As described above, according to the first preferred embodiment, while the semiconductor wafer 10 is heated entirely by the hot plate 21, the purge gas is heated by the heater 17 and is applied onto the upper surface of the semiconductor wafer 10. The gas-introducing paths 16 and gas-exhaust paths 19 are arranged at regions adjacent the peripheral edge and the center of the semiconductor wafer 10, respectively. The temperature of the semiconductor wafer 10 is higher around the peripheral edge than around the center thereof. As a result, the change rate of size of a resist pattern is made equally on the entire surface of the wafer 10; and therefore, ICs or LSIs formed on the wafer 10 can be fabricated with a higher reliability.

Second Preferred Embodiment

Figure 6:
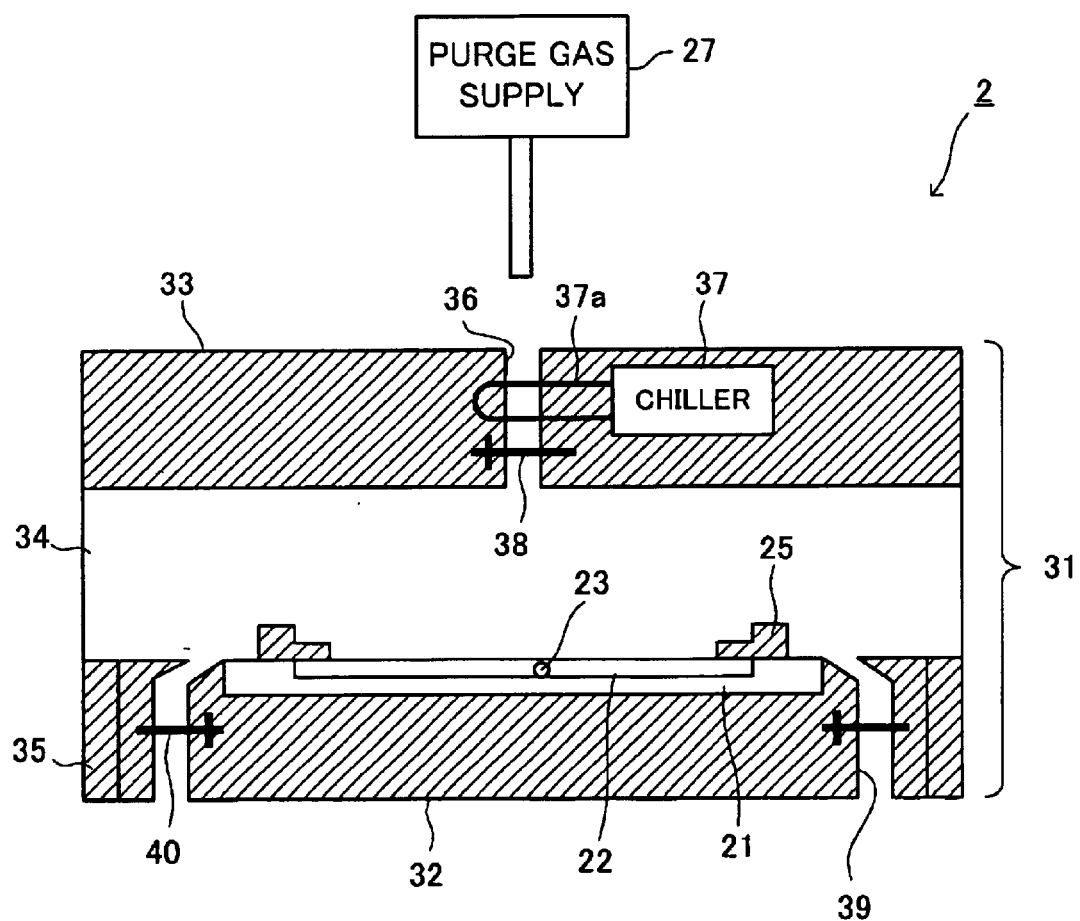
FIG. 6 is a cross-sectional view illustrating an apparatus for baking a semiconductor wafer according to a second preferred embodiment of the present invention.
Figure 7:
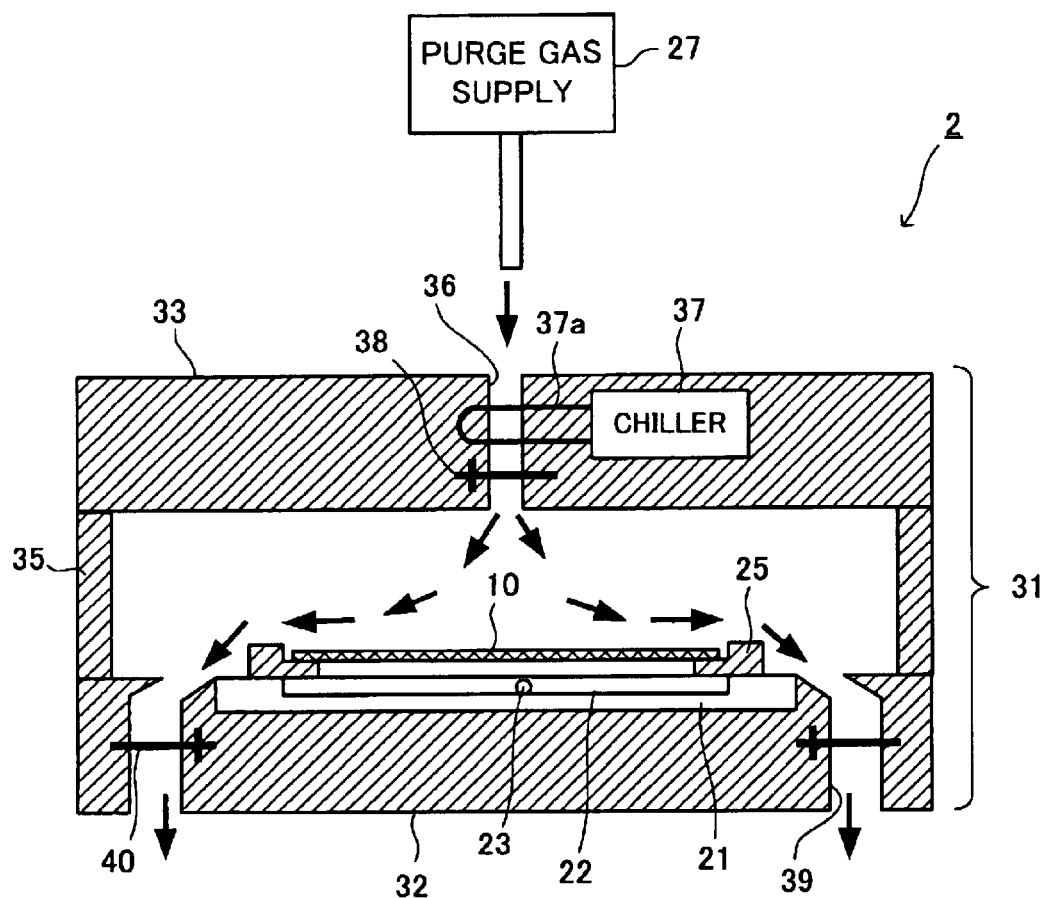
FIG. 7 is a cross-sectional view showing flow of a purge gas in a baking oven according to the second preferred embodiment, shown in FIG. 6.

FIG. 6 is a cross-sectional view showing an apparatus 2 for baking a semiconductor wafer having a resist pattern thereon, according to a second preferred embodiment of the present invention. FIG. 7 is a cross-sectional view showing the apparatus 2 in a baking process. In this embodiment, the same or corresponding elements to those in the first preferred embodiment are represented by the same reference numerals and the same description is not repeated.

As shown in FIGS. 6 and 7, the apparatus 2 includes a baking oven 31, in which a semiconductor wafer 10 having a resist pattern thereon is set. The baking oven 31 includes a lower cover 32 composing a lower portion of the baking oven 11 and an upper cover 33 composing an upper portion of the baking oven, and an inner-wall ring 35. The inner-wall ring 35 is designed to be able to rise and fall in order to open and close a wafer-introducing opening 34, which is arranged between the lower and upper covers 32 and 33. FIG. 6 shows the apparatus 2 in which the inner-wall ring 35 is at a lower position to open the wafer-introducing opening 34. FIG. 7 shows the apparatus 2 in which the inner-wall ring 35 is at a higher position to close the wafer-introducing opening 34.

As shown in FIGS. 6 and 7, the upper cover 33 is provided with a gas-introducing path 36, through which a purge gas is introduced into the baking oven 31. The gas-introducing path 36 is arranged adjacent the center of the semiconductor wafer 10. The gas-introducing path 36 is connected to a purge gas supply unit 27, which supplies a purge gas. The upper cover 33 is provided with gas chiller or cooler 37 at the gas-introducing path 36 to cool the purge gas before introducing into the baking oven 31. The upper cover 33 is also provided with valves 38 to open and close the gas-introducing path 36. The number, shape and arrangement of the gas-introducing path 36 are not limited by this embodiment as long as the purge gas is introduced from a region adjacent the center of the wafer 10 onto an upper surface of the wafer 10.

As shown in FIGS. 6 and 7, the lower cover 32 is provided with a plurality of gas-exhaust paths 39, through which a purge gas is exhausted out of the baking oven 31. The gas-exhaust paths 39 are arranged around outer potions of the baking oven 31, which face the peripheral edge or outer portion of the semiconductor wafer 10. The gas-exhaust paths 39 are joined into one common path in the lower cover 32. The lower cover 32 is provided with valves 40 in the end of the gas-exhaust paths 39 to open and close the gas-exhaust path 39. The number, shape and arrangement of the gas-exhaust paths 39 are not limited by this embodiment as long as the purge gas is exhausted from a region adjacent the peripheral edge or outer portion of the semiconductor wafer 10 out of the baking oven 31.

As shown in FIGS. 6 and 7, the apparatus 2 includes a hot plate 21, which heats a lower surface of the semiconductor wafer 10 entirely. The hot plate 21 is designed to be the same as that in the first preferred embodiment.

In a baking treatment, the semiconductor wafer 10 is heated by the heater 22 provided in the hot plate 21. The hot plate 21 and heater 22 are shaped and made of a material so as to heat an entire lower surface of the semiconductor wafer 10 uniformly. While the semiconductor wafer 10 is heated by the hot plate 21, a purge gas (for example, $N_2$ gas) is introduced through the gas-introducing path 36 into the baking oven 31. The purge gas flows radially from an area adjacent the center of the wafer 10 toward an area adjacent the peripheral edge of the semiconductor wafer 10, and is exhausted through the gas-exhaust paths 39. The purge gas is in contact with a cooling pipe 37a and is cooled in the gas-introducing path 36 to have a temperature, that is lower than that of the hot plate 21.

The optimum temperatures of the hot plate 21 and purge gas are determined based on measured data of the resist pattern after its baking treatment. That is because the optimum temperatures vary in response to many factors, including a shape and a size of the baking oven 31; a material and widths of the resist pattern on the wafer 10; a degree of heat-flow; the numbers, diameters, positions of the gas-introducing path 36 and gas-exhaust paths 39; and a composition, a flow rate, and a flowing route of the purge gas. The chiller 37 arranged at the gas-introducing path 36 can be controlled in accordance with an output of the temperature sensor 23 at the center of the hot plate 21, or other sensors, which may be arranged adjacent the gas-introducing path 36.

According to the apparatus 2, the gas-introducing path 36 is arranged at a region adjacent the center of the semiconductor wafer 10 in the upper cover 33; and the gas-exhaust paths 39 are arranged at regions adjacent the peripheral edge of the semiconductor wafer 10 in the lower cover 32. Therefore, the purge gas is mainly flowing radially as shown by arrows in FIG. 7, from the center to the peripheral edge of the semiconductor wafer 10.

The temperature of the purge gas, which is cooled before being introduced into the baking oven 31, is increased gradually above the semiconductor wafer 10, and then is exhausted through the gas-exhaust paths 39. The temperature of the purge gas is higher at a region adjacent the peripheral edge of the semiconductor wafer in which the purge gas exits the baking oven than at a region adjacent the center of the semiconductor wafer 10 in which the purge gas enters the baking oven. The distribution or ranging of the temperature of the purge gas is gradual. As a result, the resist pattern formed at a region adjacent the peripheral edge of the wafer 10 may be changed in size (shrunken) more remarkably as compared to that by a conventional method. In other words, the resist pattern is changed in size at a uniform rate on the semiconductor wafer 10 entirely. Preferably, the outer region of the semiconductor wafer 10 has a temperature 1–2° higher than the inner region.

When the baking treatment is completed, the valves 38 and 40 are closed and the inner-wall ring 35 is moved to its lower position. After that, the semiconductor wafer 10 is taken out from the wafer-introducing opening 14.

As described above, according to the second preferred embodiment, while the semiconductor wafer 10 is heated entirely by the hot plate 21, the purge gas is cooled by the chiller 17 and is applied onto the upper surface of the semiconductor wafer 10. The gas-introducing paths 36 and gas-exhaust paths 39 are arranged at regions adjacent the center and the peripheral edge of the semiconductor wafer 10, respectively. The temperature of the semiconductor wafer 10 is higher at around the peripheral edge than around the center thereof. As a result, a change rate of size of a resist pattern is made the same on the entire surface of the wafer 10; and therefore, ICs or LSIs formed on the wafer 10 can be fabricated with a higher reliability.

Third Preferred Embodiment

Figure 8:
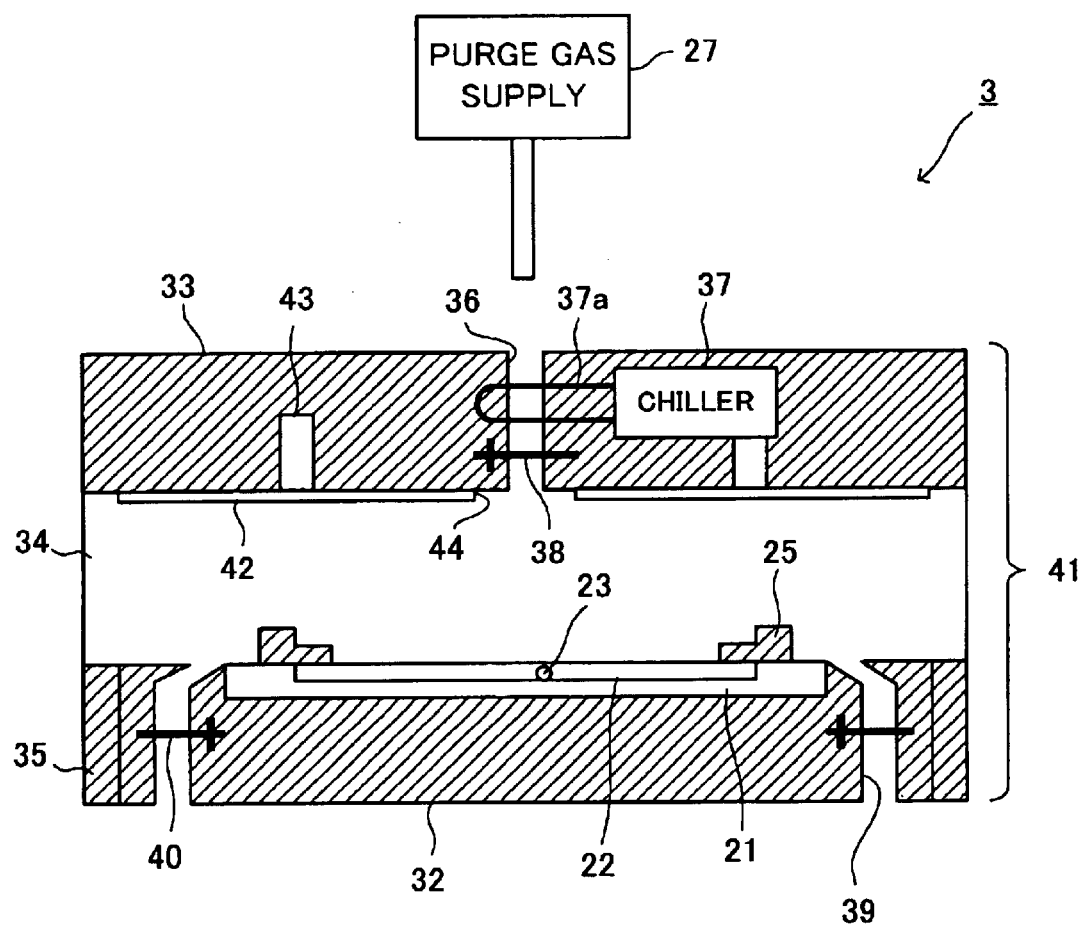
FIG. 8 is a cross-sectional view illustrating an apparatus for baking a semiconductor wafer according to a third preferred embodiment of the present invention.
Figure 9:
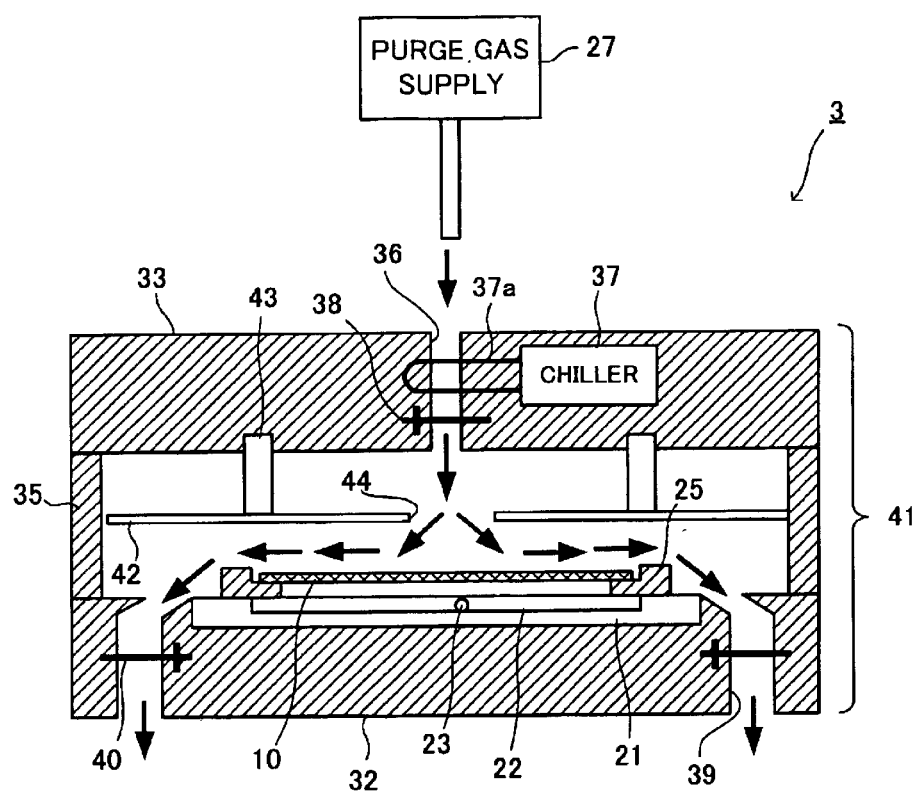
FIG. 9 is a cross-sectional view showing flow of a purge gas in a baking oven according to the third preferred embodiment, shown in FIG. 8.
Figure 10:
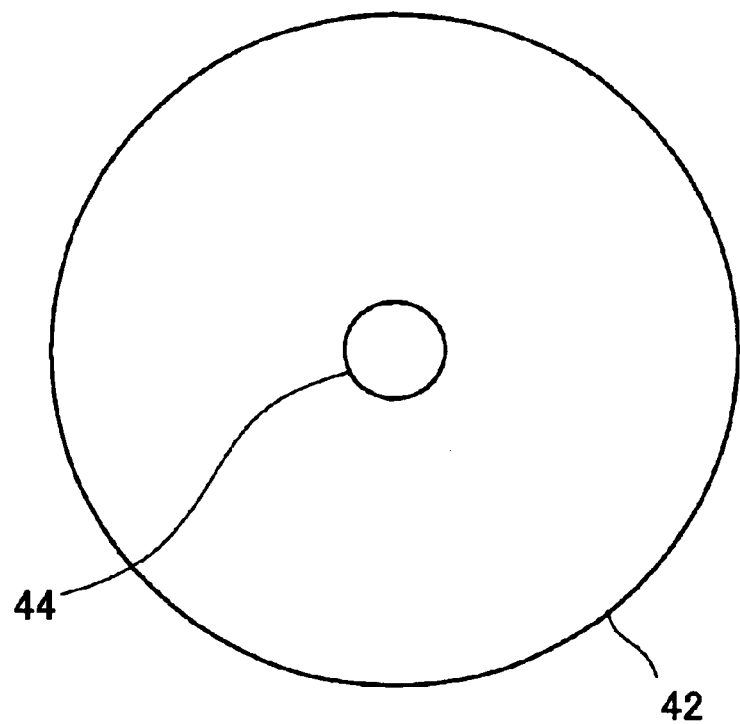
FIG. 10 is a plan view illustrating a flow-control board used in the baking oven according to the third preferred embodiment, shown in FIG. 8.

FIG. 8 is a cross-sectional view showing an apparatus 3 for baking a semiconductor wafer having a resist pattern thereon, according to a third preferred embodiment of the present invention. FIG. 9 is a cross-sectional view showing the apparatus 3 in a baking process. FIG. 10 is a plan view illustrating a flow-control board 42 used in the baking oven 41, shown in FIG. 8. In this embodiment, the same or corresponding elements to those in the first and second preferred embodiments are represented by the same reference numerals and the same description is not repeated.

The apparatus 3 includes a flow-control board 42 which is used to control a flow direction of a purge gas in a baking oven 41. The flow-control board 42 is arranged above a semiconductor wafer 10 in the baking oven 41. The apparatus 3 also includes a lift mechanism 43 which rises and falls the flow-control board 42. The flow-control board 42 is provided at its center with an opening 44, through which a purge gas is passing onto the semiconductor wafer 10.

As shown in FIGS. 8 and 9, the apparatus 3 includes a baking oven 41, in which a semiconductor wafer 10 having a resist pattern thereon is set. The baking oven 41 includes a lower cover 32 composing a lower portion of the baking oven 41 and an upper cover 33 composing an upper portion of the baking oven, and an inner-wall ring 35. The inner-wall ring 35 is designed to be able to rise and fall in order to open and close a wafer-introducing opening 34, which is arranged between the lower and upper covers 32 and 33. FIG. 8 shows the apparatus 3 in which the inner-wall ring 35 is at a lower position to open the wafer-introducing opening 34. FIG. 9 shows the apparatus 3 in which the inner-wall ring 35 is at a higher position to close the wafer-introducing opening 34.

As shown in FIGS. 8 and 9, the upper cover 33 is provided with a gas-introducing path 36, through which a purge gas is introduced into the baking oven 41. The gas-introducing path 36 is arranged adjacent the center of the semiconductor wafer 10. The gas-introducing path 36 is connected to a purge gas supply unit 27, which supplies a purge gas. The upper cover 33 is provided with gas chiller or cooler 37 at the gas-introducing path 36 to cool the purge gas before introducing into the baking oven 41. The upper cover 33 is also provided with valves 38 to open and close the gas-introducing path 36. The number, shape and arrangement of the gas-introducing path 36 is not limited by this embodiment as long as the purge gas is introduced from a region adjacent the center of the semiconductor wafer 10 onto an upper surface of the wafer 10.

As shown in FIGS. 8 and 9, the lower cover 32 is provided with a plurality of gas-exhaust paths 39, through which a purge gas is exhausted out of the baking oven 41. The gas-exhaust paths 39 are arranged around outer potions of the baking oven 41, which face the peripheral edge or outer portion of the semiconductor wafer 10. The gas-exhaust paths 39 are joined into one common path in the lower cover 32. The lower cover 32 is provided with valves 40 in the end of the gas-exhaust paths 39 to open and close the gas-exhaust path 39. The number, shape and arrangement of the gas-exhaust paths 39 are not limited by this embodiment as long as the purge gas is exhausted from a region adjacent the peripheral edge or outer portion of the semiconductor wafer 10 out of the baking oven 41.

As shown in FIGS. 8 and 9, the apparatus 3 includes a hot plate 21 which heat a lower surface of the semiconductor wafer 10 entirely. The hot plate 21 is designed to be the same as that in the first preferred embodiment.

In a baking treatment, the semiconductor wafer 10 is set at the wafer holder 25 in the baking oven 41 then, the inner-wall ring 35 goes up and closes the baking oven 41. Next, the flow-control board 42 comes down toward the semiconductor wafer 10, as shown in FIG. 9. The semiconductor wafer 10 is heated by the heater 22 provided in the hot plate 21. The hot plate 21 and heater 22 are shaped and made of a material so as to heat an entire lower surface of the semiconductor wafer 10 uniformly.

While the semiconductor wafer 10 is heated by the hot plate 21, a purge gas (for example, $N_2$ gas) is introduced through the gas-introducing path 36 and the opening 44 of the flow-control board 42 into the baking oven 41. The purge gas is flowing radially from an area adjacent the center of the wafer 10 toward an area adjacent the peripheral edge of the semiconductor wafer 10, and is exhausted through the gas-exhaust paths 39. The purge gas is in contact with a cooling pipe 37a and is cooled in the gas-introducing path 36 to have a temperature, which is lower than that of the hot plate 21.

The optimum temperatures of the hot plate 21 and purge gas are determined based on measured data of the resist pattern after its baking treatment. That is because the optimum temperatures vary in response to many factors, including a shape and a size of the baking oven 41; a material and widths of the resist pattern on the wafer 10; a degree of heat-flow; the numbers, diameters, positions of the gas-introducing path 36 and gas-exhaust paths 39; and a composition, a flow rate, a flowing route of the purge gas. The chiller 37 arranged at the gas-introducing path 36 can be controlled in accordance with an output of the temperature sensor 23 or other sensors, which may be arranged adjacent the gas-introducing path 36.

According to the apparatus 3, the gas-introducing path 36 and opening 44 of the flow-control board 42 are arranged directly above the center of the semiconductor wafer 10; and the gas-exhaust paths 39 are arranged at regions adjacent the peripheral edge of the semiconductor wafer 10 in the lower cover 32. Therefore, the purge gas is mainly flowing radially as shown by arrows in FIG. 7, from the center to the peripheral edge of the semiconductor wafer 10.

The temperature of the purge gas, which is cooled before being introduced into the baking oven 41, is increased gradually above the semiconductor wafer 10, and then is exhausted through the gas-exhaust paths 39. The temperature of the purge gas is higher at a region adjacent the peripheral edge of the semiconductor wafer in which the purge gas than at a region adjacent the center of the semiconductor wafer 10. The distribution or ranging of the temperature of the purge gas is gradual. As a result, the resist pattern formed at a region adjacent the peripheral edge of the wafer 10 may be changed in size (shrunken) more remarkably as compared to that by a conventional method. In other words, the resist pattern is changed in size at a uniform rate on the semiconductor wafer 10 entirely. Preferably, the outer region of the semiconductor wafer 10 has a temperature 1–2° C. higher than the inner region.

When the baking treatment is completed, the valves 38 and 40 are closed and the inner-wall ring 35 is moved to its lower position. After that, the semiconductor wafer 10 is taken out from the wafer-introducing opening 14.

As described above, according to the third preferred embodiment, while the semiconductor wafer 10 is heated entirely by the hot plate 21, the purge gas is cooled by the chiller 17 and is applied onto the upper surface of the semiconductor wafer 10. The gas-introducing paths 36 and gas-exhaust paths 39 are arranged at regions adjacent the center and the peripheral edge of the semiconductor wafer 10, respectively. The temperature of the semiconductor wafer 10 is higher at around the peripheral edge than around the center thereof. As a result, change rate of size of a resist pattern is made equally on the entire surface of the wafer 10; and therefore, ICs or LSIs formed on the wafer 10 can be fabricated with a higher reliability. As compared to the second preferred embodiment, a flow direction of the purge gas can be controlled precisely using the flow control board 42 with the center opening 44.

The flow-control board 42 and lift mechanism 43 are applicable to the apparatus 1 according to the first preferred embodiment.

Fourth Preferred Embodiment

Figure 11:
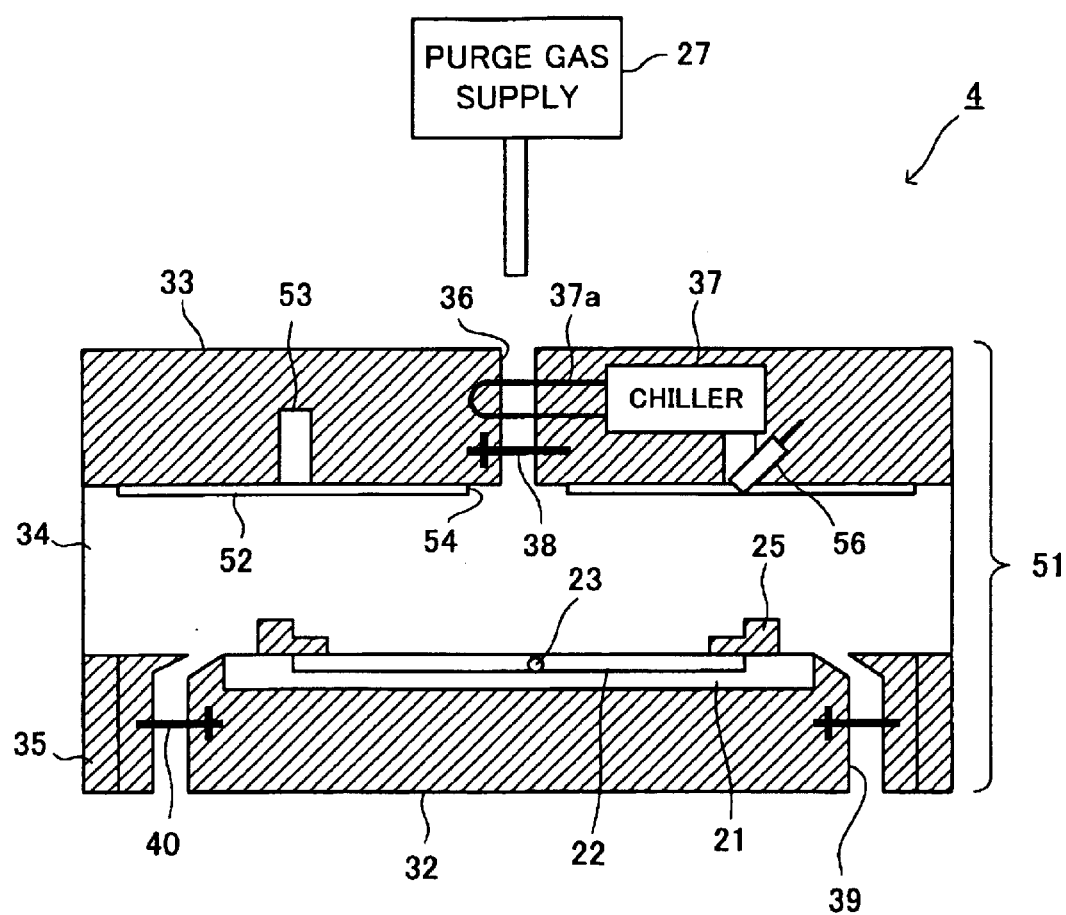
FIG. 11 is a cross-sectional view illustrating an apparatus for baking a semiconductor wafer according to a fourth preferred embodiment of the present invention.
Figure 12:
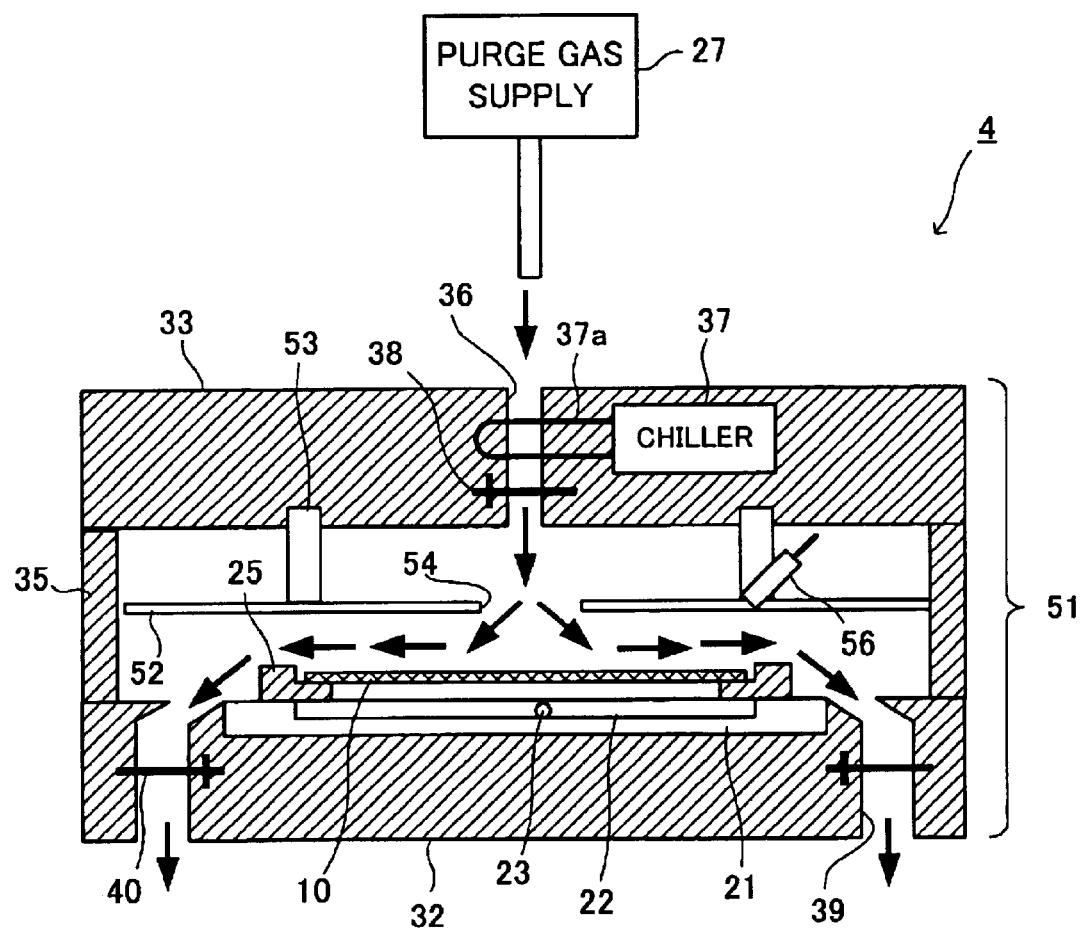
FIG. 12 is a cross-sectional view showing flow of a purge gas in a baking oven according to the fourth preferred embodiment, shown in FIG. 11.
Figure 13:
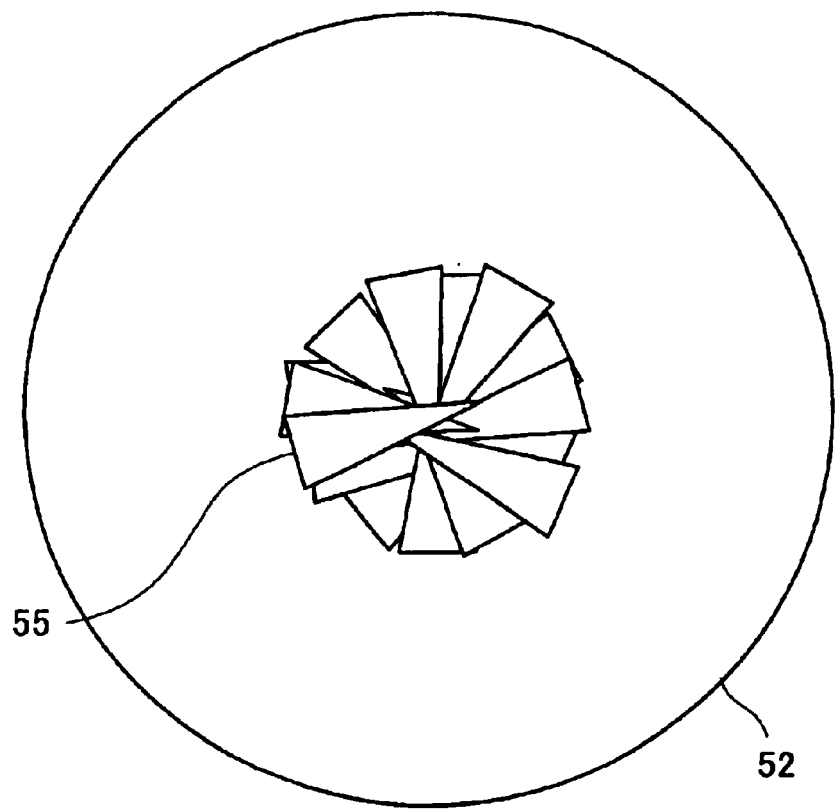
FIG. 13 is a plan view illustrating a flow-control board used in the baking oven according to the fourth preferred embodiment, shown in FIG. 11.
Figure 14:
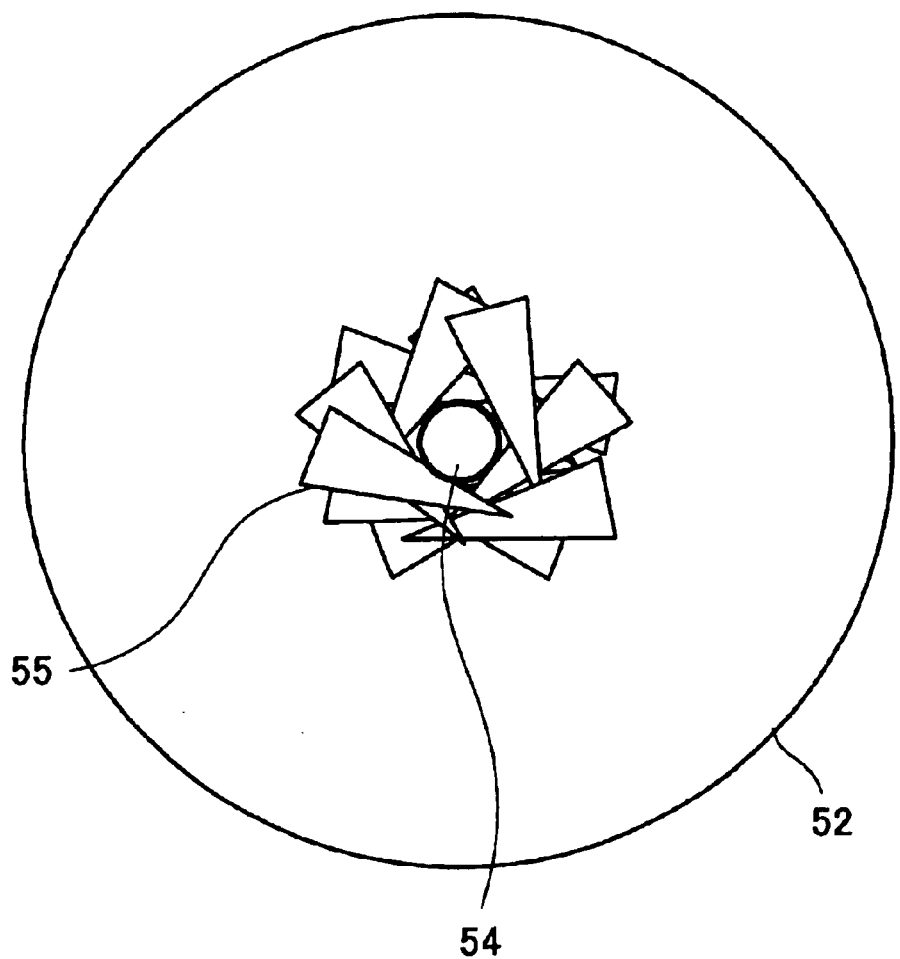
FIG. 14 is a plan view illustrating a flow-control board used in the baking oven according to the fourth preferred embodiment, shown in FIG. 11.

FIG. 11 is a cross-sectional view showing an apparatus 4 for baking a semiconductor wafer having a resist pattern thereon, according to a fourth preferred embodiment of the present invention. FIG. 12 is a cross-sectional view showing the apparatus 4 in a baking process. FIGS. 13 and 14 are plan views illustrating a flow-control board 52 used in the baking oven 51, shown in FIG. 11. In this embodiment, the same or corresponding elements to those in the first to third preferred embodiments are represented by the same reference numerals and the same description is not repeated.

The apparatus 4 includes a flow-control board 52, which is used to control a flow direction of a purge gas in a baking oven 51; a lift mechanism 53 which rises and falls the flow-control board 52; and a temperature sensor 56 which detects a temperature at an upper surface of the semiconductor wafer 10. The flow-control board 52 is arranged above a semiconductor wafer 10 in the baking oven 51. The flow-control board 52 is provided at its center with an opening 44, through which a purge gas is passing onto the semiconductor wafer 10, and with a shutter 55.

The shutter 55 is arranged at the opening 54 of the flow-control board 52 to adjust an aperture size of the opening 54. The shutter 55 is controlled in accordance with a detection result of the sensor 56. For example, the aperture formed by the shutter 55 is controlled to be wider when the temperature at the upper surface of the semiconductor wafer 10 is detected to be high. The shutter 55 may be controlled in accordance with a material or composition of the resist pattern formed on the wafer 10. A shrink rate of a resist pattern may vary according to its composition and/or quality.

As shown in FIGS. 11 and 12, the apparatus 4 includes a baking oven 51, in which a semiconductor wafer 10 having a resist pattern thereon is set. The baking oven 51 includes a lower cover 32 composing a lower portion of the baking oven 51 and an upper cover 33 composing an upper portion of the baking oven, and an inner-wall ring 35. The inner-wall ring 35 is designed to be able to rise and fall in order to open and close a wafer-introducing opening 34, which is arranged between the lower and upper covers 32 and 33. FIG. 11 shows the apparatus 4 in which the inner-wall ring 35 is at a lower position to open the wafer-introducing opening 34. FIG. 2 shows the apparatus 4 in which the inner-wall ring 35 is at a higher position to close the wafer-introducing opening 34.

The shape of the flow-control board 52; the shape position and number of the opening 54; the structure of the shutter 55; and the number of the sensor 56 are not limited by this embodiment.

As shown in FIGS. 11 and 12, the upper cover 33 is provided with a gas-introducing path 36, through which a purge gas is introduced into the baking oven 51. The gas-introducing path 36 is arranged adjacent the center of the semiconductor wafer 10. The gas-introducing path 36 is connected to a purge gas supply unit 27, which supplies a purge gas. The upper cover 33 is provided with gas chiller or cooler 37 at the gas-introducing path 36 to cool the purge gas before introducing into the baking oven 51. The upper cover 33 is also provided with valves 38 to open and close the gas-introducing path 36. The number, shape and arrangement of the gas-introducing path 36 is not limited by this embodiment as long as the purge gas is introduced from a region adjacent the center of the semiconductor wafer 10 onto an upper surface of the wafer 10.

As shown in FIGS. 11 and 12, the lower cover 32 is provided with a plurality of gas-exhaust paths 39, through which a purge gas is exhausted out of the baking oven 51. The gas-exhaust paths 39 are arranged around outer potions of the baking oven 51, which face the peripheral edge or outer portion of the semiconductor wafer 10. The gas-exhaust paths 39 are joined into one common path in the lower cover 32. The lower cover 32 is provided with valves 40 in the end of the gas-exhaust paths 39 to open and close the gas-exhaust path 39. The number, shape and arrangement of the gas-exhaust paths 39 are not limited by this embodiment as long as the purge gas is exhausted from a region adjacent the peripheral edge or outer portion of the semiconductor wafer 10 out of the baking oven 51.

As shown in FIGS. 11 and 12, the apparatus 4 includes a hot plate 21 which heat a lower surface of the semiconductor wafer 10 entirely. The hot plate 21 is designed to be the same as that in the first preferred embodiment. In this embodiment, the gas-introducing path 36 may be offset from the center of the semiconductor wafer 10, because the aperture 54 of the flow-control board 52 guides the purge gas toward the center of the upper surface of the semiconductor wafer 10.

In a baking treatment, the semiconductor wafer 10 is set at the wafer holder 25 in the baking oven 51 then, the inner-wall ring 35 goes up and closes the baking oven 51. Next, the flow-control board 52 comes down toward the semiconductor wafer 10, as shown in FIG. 12. The semiconductor wafer 10 is heated by the heater 22 provided in the hot plate 21. The hot plate 21 and heater 22 are shaped and made of a material so as to heat an entire lower surface of the semiconductor wafer 10 uniformly.

While the semiconductor wafer 10 is heated by the hot plate 21, a purge gas (for example, $N_2$ gas) is introduced through the gas-introducing path 36 and the aperture 54 of the flow-control board 52 into the baking oven 51. The purge gas is flowing radially from an area adjacent the center of the wafer 10 toward an area adjacent the peripheral edge of the semiconductor wafer 10, and is exhausted through the gas-exhaust paths 39. The purge gas is in contact with a cooling pipe 37a and is cooled in the gas-introducing path 36 to have a temperature, which is lower than that of the hot plate 21.

The optimum temperatures of the hot plate 21 and purge gas are determined based on measured data of the resist pattern after its baking treatment. That is because the optimum temperatures vary in response to many factors, including a shape and a size of the baking oven 51; a material and widths of the resist pattern on the wafer 10; a degree of heat-flow; the numbers, diameters, positions of the gas-introducing path 36 and gas-exhaust paths 39; and a composition, a flow rate, a flowing route of the purge gas. The chiller 37 arranged at the gas-introducing path 36 can be controlled in accordance with detection results of the sensor 23 and/or other sensors, which may be arranged adjacent the gas-introducing path 36.

According to the apparatus 4, the gas-introducing path 36 and aperture 54 of the flow-control board 52 are arranged directly above the center of the semiconductor wafer 10; and the gas-exhaust paths 39 are arranged at regions adjacent the peripheral edge of the semiconductor wafer 10 in the lower cover 32. Therefore, the purge gas is mainly flowing radially as shown by arrows in FIG. 12, from the center to the peripheral edge of the semiconductor wafer 10.

The temperature of the purge gas, which is cooled before being introduced into the baking oven 51, is increased gradually above the semiconductor wafer 10, and then is exhausted through the gas-exhaust paths 39. The temperature of the purge gas is higher at a region adjacent the peripheral edge of the semiconductor wafer in which the purge gas than at a region adjacent the center of the semiconductor wafer 10. The distribution or ranging of the temperature of the purge gas is gradual. As a result, the resist pattern formed at a region adjacent the peripheral edge of the wafer 10 may be changed in size (shrunken) more remarkably as compared to that by a conventional method. In other words, the resist pattern is changed in size at a uniform rate on the semiconductor wafer 10 entirely. Preferably, the outer region of the semiconductor wafer 10 has a temperature 1–2° C. higher than the inner region.

When the baking treatment is completed, the valves 38 and 40 are closed and the inner-wall ring 35 is moved to its lower position. After that, the semiconductor wafer 10 is taken out from the wafer-introducing opening 14.

As described above, according to the fourth preferred embodiment, while the semiconductor wafer 10 is heated entirely by the hot plate 21, the purge gas is cooled by the chiller 37 and is applied onto the upper surface of the semiconductor wafer 10. The gas-introducing paths 36 and gas-exhaust paths 39 are arranged at regions adjacent the center and the peripheral edge of the semiconductor wafer 10, respectively.

The temperature of the semiconductor wafer 10 is higher at around the peripheral edge than around the center thereof. As a result, change rate of size of a resist pattern is made equally on the entire surface of the wafer 10; and therefore, ICs or LSIs formed on the wafer 10 can be fabricated with a higher reliability. As compared to the second preferred embodiment, a flow direction of the purge gas can be controlled precisely using the flow control board 52 with the aperture 54 and shutter 55. The size of the aperture 54 may be controlled in accordance with the temperature of the semiconductor wafer 10, as a result, reliability of ICs or LSIs to be fabricated gets higher.

The flow-control board 52 and lift mechanism 53 are applicable to the apparatus 1 according to the first preferred embodiment.

Fifth Preferred Embodiment

Figure 15:
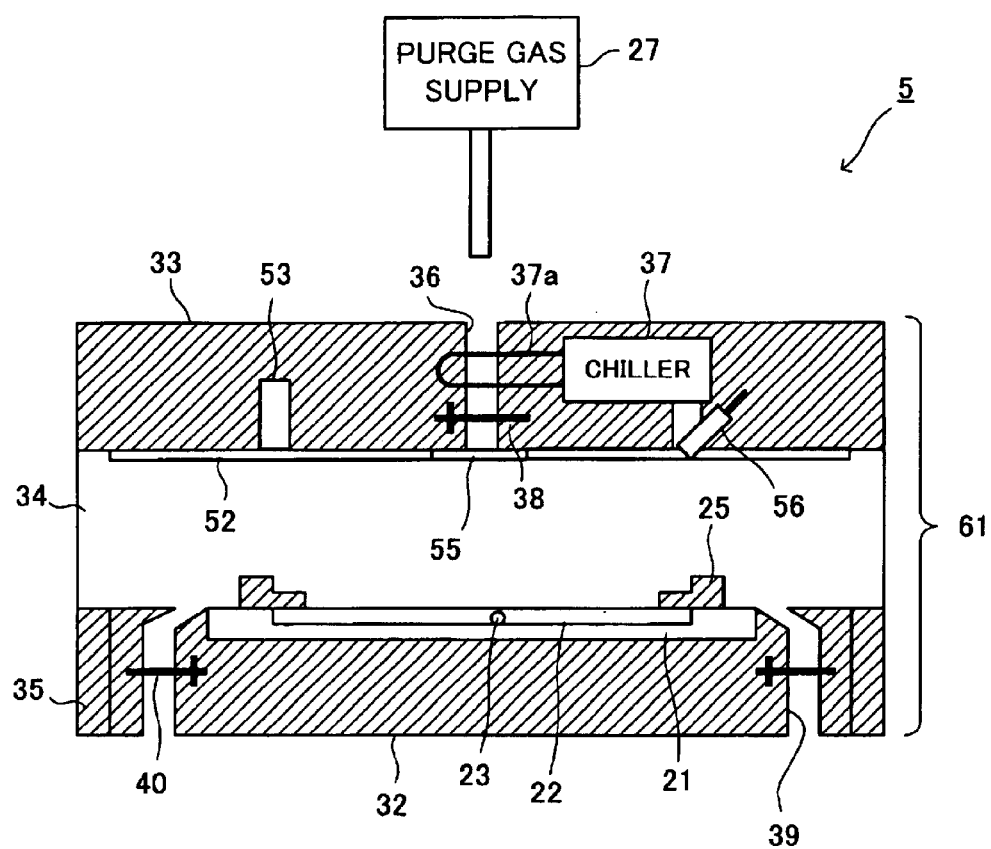
FIG. 15 is a cross-sectional view illustrating an apparatus for baking a semiconductor wafer according to a fifth preferred embodiment of the present invention.
Figure 16:
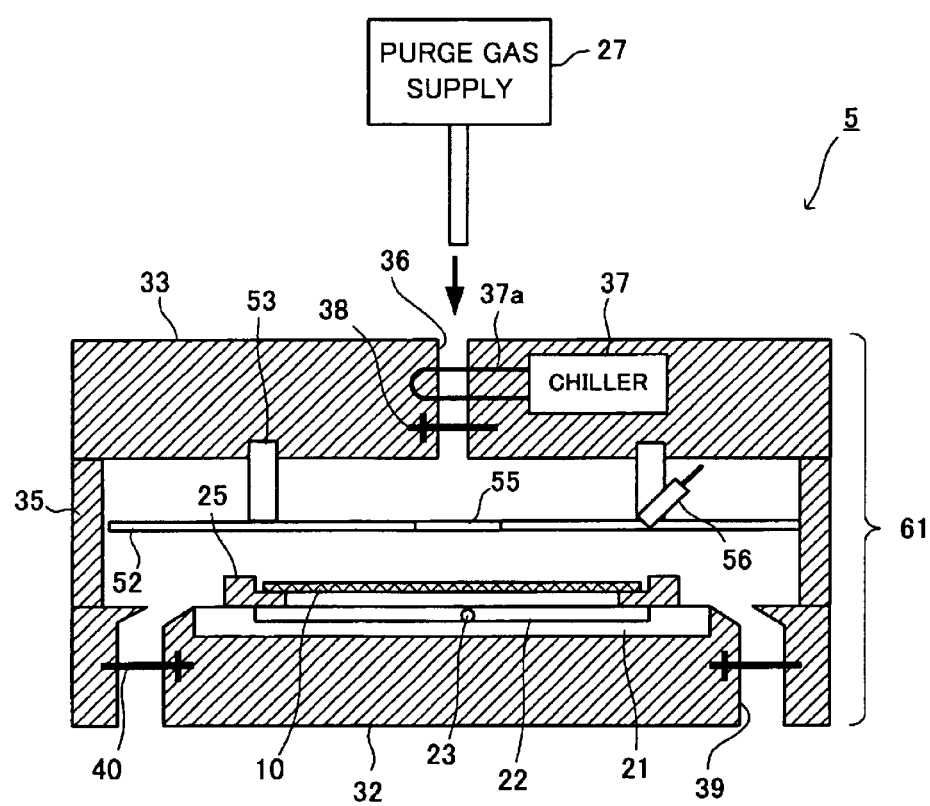
FIG. 16 is a cross-sectional view showing the apparatus in operation according to the fifth preferred embodiment, shown in FIG. 15.
Figure 17:
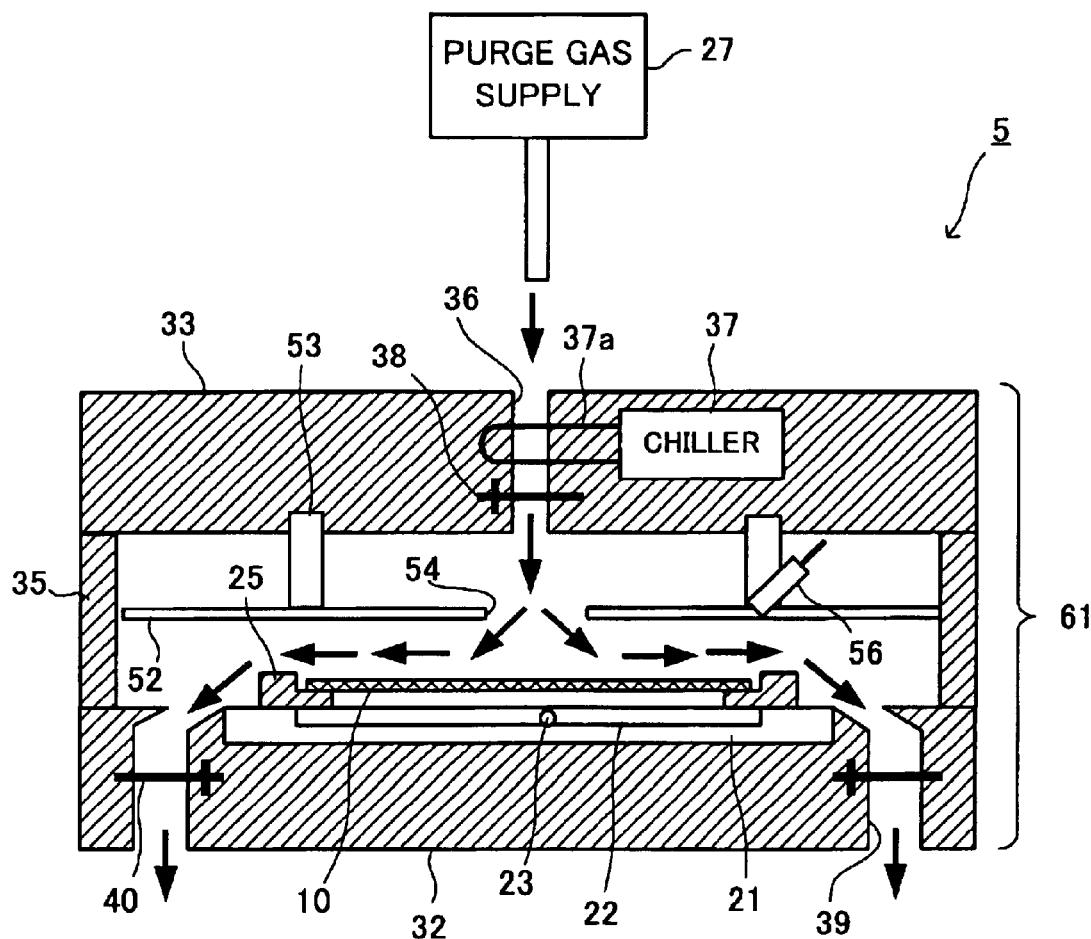
FIG. 17 is a cross-sectional view showing flow of a purge gas in a baking oven according to the fifth preferred embodiment, shown in FIG. 15.

FIG. 15 is a cross-sectional view showing an apparatus 5 for baking a semiconductor wafer having a resist pattern thereon, according to a fifth preferred embodiment of the present invention. FIG. 16 is a cross-sectional view showing the apparatus 5 in a baking process before introducing a purge gas. FIG. 17 is a cross-sectional view showing the apparatus 5 in a baking process, in which a purge gas is introduced into a baking oven 61. In this embodiment, the same or corresponding elements to those in the first to fourth preferred embodiments are represented by the same reference numerals and the same description is not repeated.

According to this embodiment, a shutter 55 is closed when a heating operation to a semiconductor wafer 10 is started, and then, is closed when a purge gas is introduced into the baking oven 61.

The apparatus 5 includes a flow-control board 52, which is used to control a flow direction of a purge gas in a baking oven 61; a lift mechanism 53 which rises and falls the flow-control board 52; and a temperature sensor 56 which detects a temperature at an upper surface of the semiconductor wafer 10. The flow-control board 52 is arranged above a semiconductor wafer 10 in the baking oven 61. The flow-control board 52 is provided at its center with an opening 44, through which a purge gas is passing onto the semiconductor wafer 10, and with a shutter 55.

The shutter 55 is arranged at the aperture 54 of the flow-control board 52 to adjust an aperture size thereof. The shutter 55 is controlled in accordance with a detection result of the sensor 56. For example, the aperture formed by the shutter 55 is controlled to be wider when the temperature at the upper surface of the semiconductor wafer 10 is detected to be high. The shutter 55 may be controlled in accordance with a material or composition of the resist pattern formed on the wafer 10. A shrink rate of a resist pattern may vary according to its composition and/or quality.

As shown in FIGS. 15, 16 and 17, the apparatus 5 includes a baking oven 61, in which a semiconductor wafer 10 having a resist pattern thereon is set. The baking oven 61 includes a lower cover 32 composing a lower portion of the baking oven 61 and an upper cover 33 composing an upper portion of the baking oven, and an inner-wall ring 35. The inner-wall ring 35 is designed to be able to rise and fall in order to open and close a wafer-introducing opening 34, which is arranged between the lower and upper covers 32 and 33. FIG. 15 shows the apparatus 5 in which the inner-wall ring 35 is at a lower position to open the wafer-introducing opening 34. FIG. 16 shows the apparatus 5 in which the inner-wall ring 35 is at a higher position to close the wafer-introducing opening 34.

The shape of the flow-control board 52; the shape position and number of the opening 54; the structure of the shutter 55; and the number of the sensor 56 are not limited by this embodiment.

As shown in FIGS. 15, 16 and 17, the upper cover 33 is provided with a gas-introducing path 36, through which a purge gas is introduced into the baking oven 61. The gas-introducing path 36 is arranged adjacent the center of the semiconductor wafer 10. The gas-introducing path 36 is connected to a purge gas supply unit 27, which supplies a purge gas. The upper cover 33 is provided with gas chiller or cooler 37 at the gas-introducing path 36 to cool the purge gas before introducing into the baking oven 61. The upper cover 33 is also provided with valves 38 to open and close the gas-introducing path 36. The number, shape and arrangement of the gas-introducing path 36 is not limited by this embodiment as long as the purge gas is introduced from a region adjacent the center of the semiconductor wafer 10 onto an upper surface of the wafer 10.

As shown in FIGS. 15, 16 and 17, the lower cover 32 is provided with a plurality of gas-exhaust paths 39, through which a purge gas is exhausted out of the baking oven 61. The gas-exhaust paths 39 are arranged around outer potions of the baking oven 61, which face the peripheral edge or outer portion of the semiconductor wafer 10. The gas-exhaust paths 39 are joined into one common path in the lower cover 32. The lower cover 32 is provided with valves 40 in the end of the gas-exhaust paths 39 to open and close the gas-exhaust path 39. The number, shape and arrangement of the gas-exhaust paths 39 are not limited by this embodiment as long as the purge gas is exhausted from a region adjacent the peripheral edge or outer portion of the semiconductor wafer 10 out of the baking oven 61.

As shown in FIGS. 15, 16 and 17, the apparatus 5 includes a hot plate 21 which heat a lower surface of the semiconductor wafer 10 entirely. The hot plate 21 is designed to be the same as that in the first preferred embodiment. In this embodiment, the gas-introducing path 36 may be offset from the center of the semiconductor wafer 10, because the aperture 54 of the flow-control board 52 guides the purge gas toward the center of the upper surface of the semiconductor wafer 10.

In a baking treatment, the semiconductor wafer 10 is set at the wafer holder 25 in the baking oven 61 then, the inner-wall ring 35 goes up and closes the baking oven 61. Next, the flow-control board 52 comes down toward the semiconductor wafer 10, as shown in FIG. 16. The semiconductor wafer 10 is heated by the heater 22 provided in the hot plate 21. At this time, the shutter 55 is maintained to be closed. The hot plate 21 and heater 22 are shaped and made of a material so as to heat an entire lower surface of the semiconductor wafer 10 uniformly.

After a predetermined period of time since the heating operation with the hot plate 21 is started, the shutter 55 is opened to introduce a purge gas (for example, $N_2$ gas) through the gas-introducing path 36 and the aperture 54 of the flow-control board 52 into the baking oven 61. The shutter 55 may be opened in response to detection result of the sensor 23. In the baking oven 61, the purge gas is flowing radially from an area adjacent the center of the wafer 10 toward an area adjacent the peripheral edge of the semiconductor wafer 10, and is exhausted through the gas-exhaust paths 39. The purge gas is in contact with a cooling pipe 37a and is cooled in the gas-introducing path 36 to have a temperature, which is lower than that of the hot plate 21.

The optimum temperatures of the hot plate 21 and purge gas are determined based on measured data of the resist pattern after its baking treatment. That is because the optimum temperatures vary in response to many factors, including a shape and a size of the baking oven 61; a material and widths of the resist pattern on the wafer 10; a degree of heat-flow; the numbers, diameters, positions of the gas-introducing path 36 and gas-exhaust paths 39; and a composition, a flow rate, a flowing route of the purge gas. The chiller 37 arranged at the gas-introducing path 36 can be controlled in accordance with detection results of the sensor 23 and/or other sensors, which may be arranged adjacent the gas-introducing path 36.

According to the apparatus 5, the gas-introducing path 36 and aperture 54 of the flow-control board 52 are arranged directly above the center of the semiconductor wafer 10; and the gas-exhaust paths 39 are arranged at regions adjacent the peripheral edge of the semiconductor wafer 10 in the lower cover 32. Therefore, the purge gas is mainly flowing radially as shown by arrows in FIG. 17, from the center to the peripheral edge of the semiconductor wafer 10.

The temperature of the purge gas, which is cooled before being introduced into the baking oven 61, is increased gradually above the semiconductor wafer 10, and then is exhausted through the gas-exhaust paths 39. The temperature of the purge gas is higher at a region adjacent the peripheral edge of the semiconductor wafer in which the purge gas than at a region adjacent the center of the semiconductor wafer 10. The distribution or ranging of the temperature of the purge gas is gradual. As a result, the resist pattern formed at a region adjacent the peripheral edge of the wafer 10 may be changed in size (shrunken) more remarkably as compared to that by a conventional method. In other words, the resist pattern is changed in size at a uniform rate on the semiconductor wafer 10 entirely. Preferably, the outer region of the semiconductor wafer 10 has a temperature 1–2° C. higher than the inner region.

When the baking treatment is completed, the valves 38 and 40 are closed and the inner-wall ring 35 is moved to its lower position. After that, the semiconductor wafer 10 is taken out from the wafer-introducing opening 14.

As described above, according to the fifth preferred embodiment, while the semiconductor wafer 10 is heated entirely by the hot plate 21, the purge gas is cooled by the chiller 37 and is applied onto the upper surface of the semiconductor wafer 10. The gas-introducing paths 36 and gas-exhaust paths 39 are arranged at regions adjacent the center and the peripheral edge of the semiconductor wafer 10, respectively.

The temperature of the semiconductor wafer 10 is higher at around the peripheral edge than around the center thereof. As a result, change rate of size of a resist pattern is made equally on the entire surface of the wafer 10; and therefore, ICs or LSIs formed on the wafer 10 can be fabricated with a higher reliability. As compared to the second preferred embodiment, a flow direction of the purge gas can be controlled precisely using the flow control board 52 with the aperture 54 and shutter 55. The size of the aperture 54 and open timing thereof may be controlled in accordance with the temperature of the semiconductor wafer 10, as a result, reliability of ICs or LSIs to be fabricated gets higher.

The flow-control board 52 and lift-mechanism 53 are applicable to the apparatus 1 according to the first preferred embodiment.

Sixth Preferred Embodiment

Figure 18:
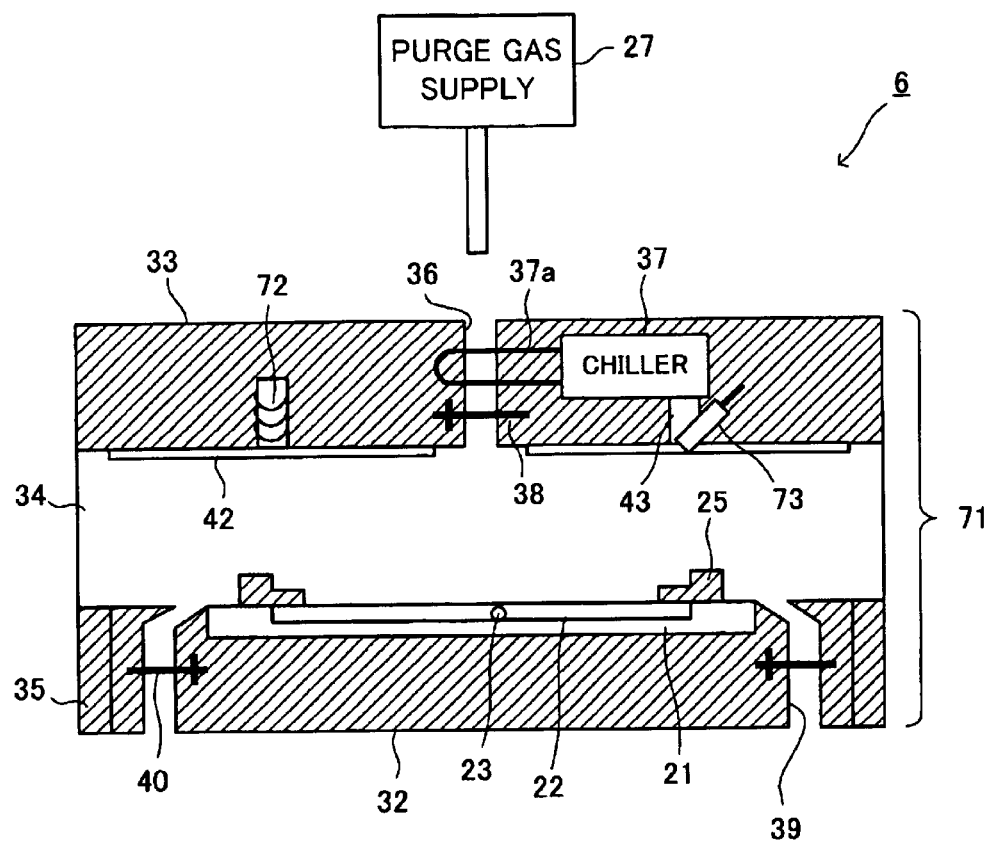
FIG. 18 is a cross-sectional view illustrating an apparatus for baking a semiconductor wafer according to a sixth preferred embodiment of the present invention.
Figure 19:
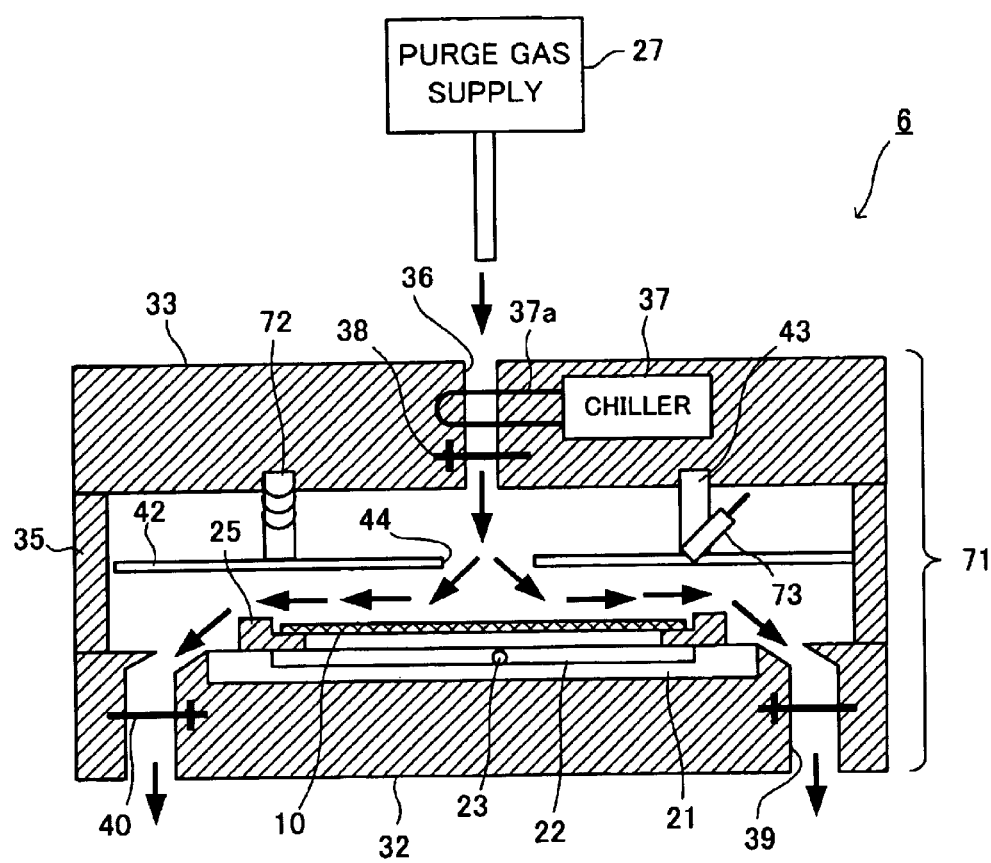
FIG. 19 is a cross-sectional view showing flow of a purge gas in a baking oven according to the sixth preferred embodiment, shown in FIG. 18.

FIG. 18 is a cross-sectional view showing an apparatus 6 for baking a semiconductor wafer having a resist pattern thereon, according to a sixth preferred embodiment of the present invention. FIG. 19 is a cross-sectional view showing the apparatus 6 in a baking process. In this embodiment, the same or corresponding elements to those in the first to fifth preferred embodiments are represented by the same reference numerals and the same description is not repeated.

The apparatus 6 includes a flow-control board 42 which is used to control a flow direction of a purge gas in a baking oven 41. The flow-control board 42 is arranged above a semiconductor wafer 10 in the baking oven 41. The apparatus 6 also includes a lift mechanism 43 which rises and falls the flow-control board 42. The flow-control board 42 is provided at its center with an aperture or opening 44, through which a purge gas is passing onto the semiconductor wafer 10.

The apparatus 6 includes a heater and/or chiller 72 to heat and/or cool the flow-control board 42, a controller (not shown) which controls the heater 72, and a temperature sensor 73 which detects a temperature at an upper surface of the semiconductor wafer 10. The flow-control board 42 is heated or cooled by the heater 72 within a period of time between the treated semiconductor is taken out and a new one is introduced. In other words, the flow-control board 42 is controlled in temperature to have an original or optimum value after a baking process. In this embodiment, the flow-control board 42 is heated, because the purge gas is cooled while the baking treatment is carried out.

According to this embodiment, the flow-control board 42 is controlled in temperature at the same value before starting a baking treatment. The quality of size and shape of the resist pattern can be uniform or reliable from wafer to wafer. As a result, ICs or LSIs fabricated from such wafers are reliable as well.

In a baking treatment, the semiconductor wafer 10 is set at the wafer holder 25 in the baking oven 71 then, the inner-wall ring 35 goes up and closes the baking oven 71. Next, the flow-control board 42 comes down toward the semiconductor wafer 10, as shown in FIG. 19. The semiconductor wafer 10 is heated by the heater 22 provided in the hot plate 21. The hot plate 21 and heater 22 are shaped and made of a material so as to heat an entire lower surface of the semiconductor wafer 10 uniformly.

While the semiconductor wafer 10 is heated by the hot plate 21, a purge gas (for example, $N_2$ gas) is introduced through the gas-introducing path 36 and the opening 44 of the flow-control board 42 into the baking oven 71. The purge gas is flowing radially from an area adjacent the center of the wafer 10 toward an area adjacent the peripheral edge of the semiconductor wafer 10, and is exhausted through the gas-exhaust paths 39. The purge gas is in contact with a cooling pipe 37a and is cooled in the gas-introducing path 36 to have a temperature, which is lower than that of the hot plate 21.

The optimum temperatures of the hot plate 21 and purge gas are determined based on measured data of the resist pattern after its baking treatment. That is because the optimum temperatures vary in response to many factors, including a shape and a size of the baking oven 71; a material and widths of the resist pattern on the wafer 10; a degree of heat-flow; the numbers, diameters, positions of the gas-introducing path 36 and gas-exhaust paths 39; and a composition, a flow rate, a flowing route of the purge gas. The chiller 37 arranged at the gas-introducing path 36 can be controlled in accordance with an output of the temperature sensor 23 or other sensors, which may be arranged adjacent the gas-introducing path 36.

According to the apparatus 6, the gas-introducing path 36 and opening 44 of the flow-control board 42 are arranged directly above the center of the semiconductor wafer 10; and the gas-exhaust paths 39 are arranged at regions adjacent the peripheral edge of the semiconductor wafer 10 in the lower cover 32. Therefore, the purge gas is mainly flowing radially as shown by arrows in FIG. 19, from the center to the peripheral edge of the semiconductor wafer 10.

The temperature of the purge gas, which is cooled before being introduced into the baking oven 71, is increased gradually above the semiconductor wafer 10, and then is exhausted through the gas-exhaust paths 39. The temperature of the purge gas is higher at a region adjacent the peripheral edge of the semiconductor wafer in which the purge gas than at a region adjacent the center of the semiconductor wafer 10. The distribution or ranging of the temperature of the purge gas is gradual. As a result, the resist pattern formed at a region adjacent the peripheral edge of the wafer 10 may be changed in size (shrunken) more remarkably as compared to that by a conventional method. In other words, the resist pattern is changed in size at a uniform rate on the semiconductor wafer 10 entirely. Preferably, the outer region of the semiconductor wafer 10 has a temperature 1–2° C. higher than the inner region.

When the baking treatment is completed, the valves 38 and 40 are closed and the inner-wall ring 35 is moved to its lower position. After that, the semiconductor wafer 10 is taken out from the wafer-introducing opening 34.

As described above, according to the sixth preferred embodiment, while the semiconductor wafer 10 is heated entirely by the hot plate 21, the purge gas is cooled by the chiller 17 and is applied onto the upper surface of the semiconductor wafer 10. The gas-introducing paths 36 and gas-exhaust paths 39 are arranged at regions adjacent the center and the peripheral edge of the semiconductor wafer 10, respectively. The temperature of the semiconductor wafer 10 is higher at around the peripheral edge than around the center thereof. As a result, change rate of size of a resist pattern is made equally on the entire surface of the wafer 10; and therefore, ICs or LSIs formed on the wafer 10 can be fabricated with a higher reliability. As compared to the second preferred embodiment, a flow direction of the purge gas can be controlled precisely using the flow control board 42 with the center opening 44.

As described above, according to this embodiment, the flow-control board 42 is controlled in temperature at the same value before starting a baking treatment. The quality of size and shape of the resist pattern can be uniform or reliable from wafer to wafer. As a result, ICs or LSIs fabricated from such wafers are reliable as well.

The flow-control board 42 and lift mechanism 43 are applicable to the apparatus 1 according to the first preferred embodiment.

Seventh Preferred Embodiment

Figure 20:
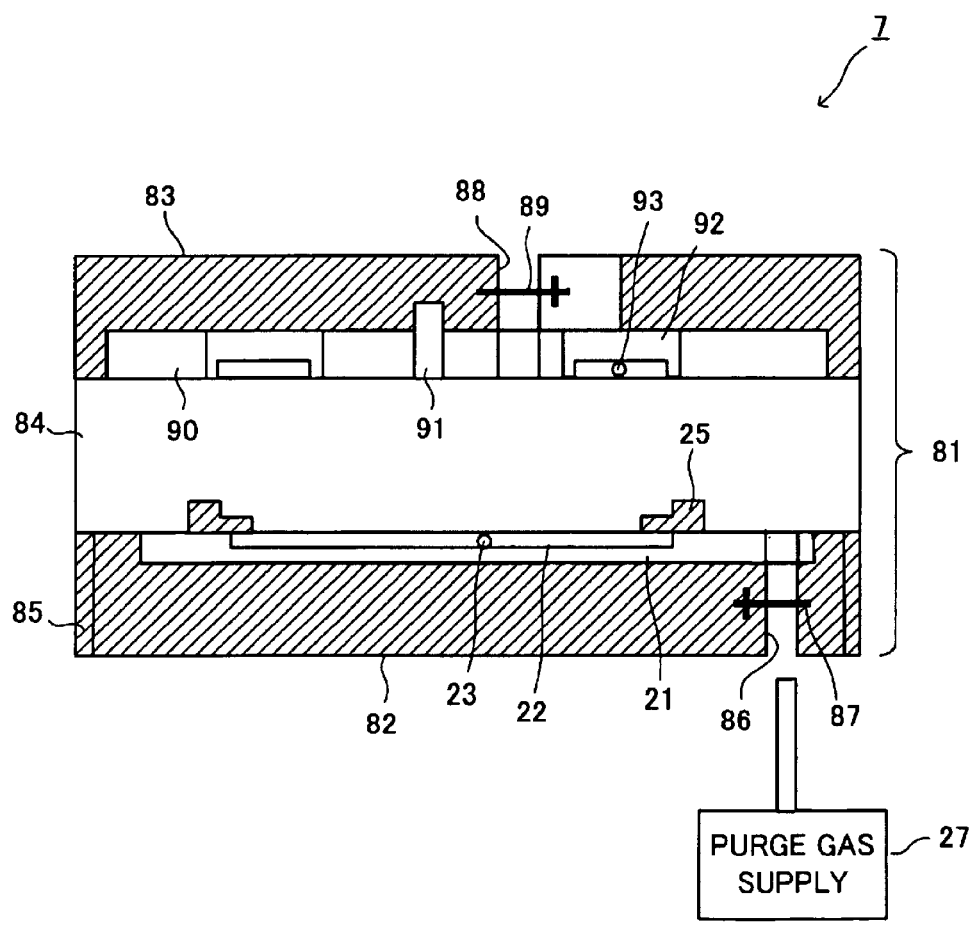
FIG. 20 is a cross-sectional view illustrating an apparatus for baking a semiconductor wafer according to a seventh preferred embodiment of the present invention.
Figure 21:
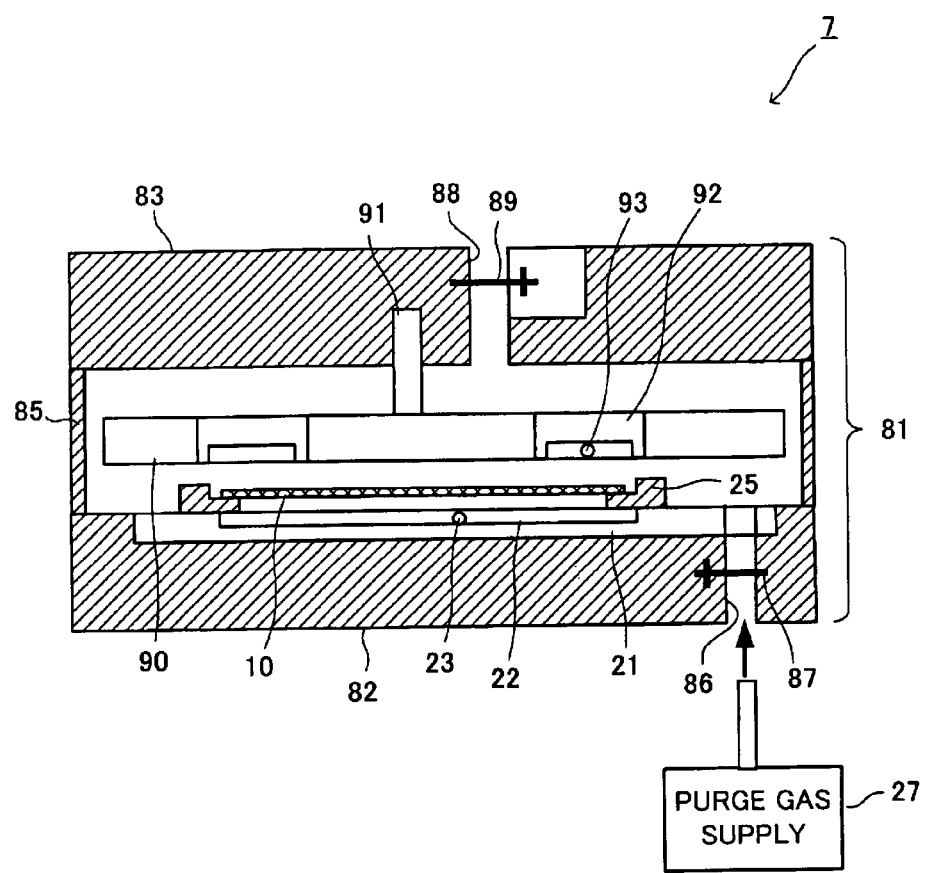
FIG. 21 is a cross-sectional view showing the apparatus in operation according to the seventh preferred embodiment, shown in FIG. 20.
Figure 22:
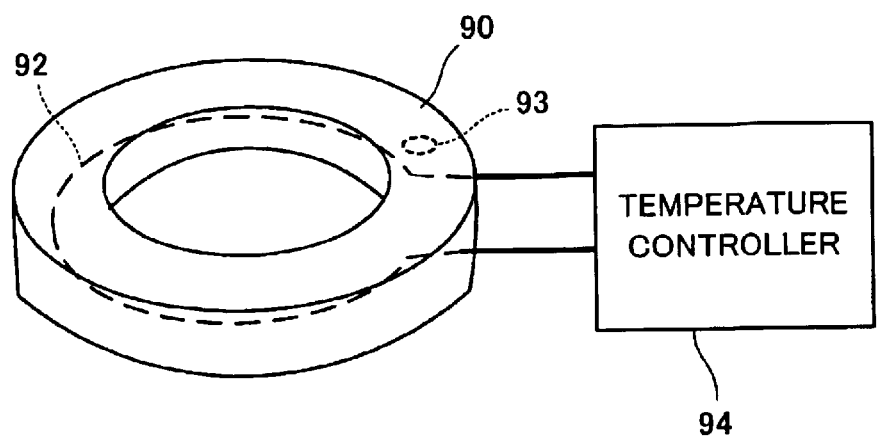
FIG. 22 is a diagram showing an upper hot plate used in the apparatus according to the seventh preferred embodiment, shown in FIG. 20.

FIG. 20 is a cross-sectional view showing an apparatus 7 for baking a semiconductor wafer having a resist pattern thereon, according to a seventh preferred embodiment of the present invention. FIG. 21 is a cross-sectional view showing the apparatus 7 in a baking process. FIG. 22 shows an upper hot plate used in the seventh preferred embodiment. In this embodiment, the same or corresponding elements to those in the first to sixth preferred embodiments are represented by the same reference numerals and the same description is not repeated.

As shown in FIGS. 20 and 21, the apparatus 7 includes a baking oven 81, in which a semiconductor wafer 10 having a resist pattern thereon is set. The baking oven 81 includes a lower cover 82 composing a lower portion of the baking oven 81 and an upper cover 83 composing an upper portion of the baking oven, and an inner-wall ring 85. The inner-wall ring 85 is designed to be able to rise and fall in order to open and close a wafer-introducing opening 84, which is arranged between the lower and upper covers 82 and 83. FIG. 20 shows the apparatus 7 in which the inner-wall ring 85 is at a lower position to open the wafer-introducing opening 84. FIG. 21 shows the apparatus 7 in which the inner-wall ring 85 is at a higher position to close the wafer-introducing opening 84.

As shown in FIGS. 20 and 21, the lower cover 82 is provided with a gas-introducing path 86, through which a purge gas is introduced into the baking oven 81. The gas-introducing path 86 is connected to a purge gas supply unit 27, which supplies a purge gas. The lower cover 82 is provided with valve 87 to open and close the gas-introducing path 86. The number, shape and arrangement of the gas-introducing path 86 are not limited by this embodiment as long as the purge gas is introduced into the baking oven 81.

As shown in FIGS. 20 and 21, the upper cover 83 is provided with a gas-exhaust path 88, through which a purge gas is exhausted out of the baking oven 81. The upper cover 83 is also provided with a valve 89 in the gas-exhaust path 88 to open and close the gas-exhaust path 88. The number, shape and arrangement of the gas-exhaust path 88 are not limited by this embodiment as long as the purge gas is exhausted out of the baking oven 81.

As shown in FIGS. 20 and 21, the apparatus 7 includes a hot plate 21 which heat a lower surface of the semiconductor wafer 10 entirely. The hot plate 21 includes a wafer heater 22 and a temperature sensor 23. The apparatus 7 also includes a temperature controller (not shown) which control a voltage applied to the wafer heater 22 in accordance with an output signal from the temperature sensor 23. The hot plate 21 is provided with a wafer holder 25 to hold the semiconductor wafer 10 at a proper position.

As shown in FIGS. 20 to 22, the baking apparatus 7 further includes an upper hot plate 90, arranged above the semiconductor wafer 10 in the baking oven 81, and a lift mechanism 91 for moving the upper hot plate 90 up and down in the baking oven 81. As shown in FIG. 22, the upper hot plate 90 includes a wafer heater 92 and a temperature sensor 93. The baking apparatus 7 includes a temperature controller 94 which controls a voltage to be applied to the wafer heater 92 in accordance with a detection result of the temperature sensor 93.

Although in FIG. 22, the upper hot plate 90 is shaped to be round, the hot plate 90 may have other shapes as long as the hot plate 90 heats an outer portion of the semiconductor wafer 10. The temperature sensor 93 is provided inside the upper hot plate 90, however, the sensor 93 can be arranged other positions. Further, a plurality of sensors can be employed. For example, the temperature controller 94 may operate in response to the average value of detection results supplied from plural temperature sensors.

In a baking treatment, the semiconductor wafer 10 is heated by the heater 22 provided in the hot plate 21. The hot plate 21 and heater 22 are shaped and made of a material so as to heat an entire lower surface of the semiconductor wafer 10 uniformly. On the semiconductor wafer 10, portions adjacent the peripheral edge are heated by the upper hot plate 90. While the semiconductor wafer 10 is heated by the hot plates 21 and 90, a purge gas (for example, $N_2$ gas) is introduced through the gas-introducing path 86 into the baking oven 81. The purge gas is exhausted through the gas-exhaust path 88. Preferably, the outer region of the semiconductor wafer 10 has a temperature 1–2° C. higher than the inner region.

When the baking treatment is completed, the valves 87 and 89 are closed and the inner-wall ring 85 is moved to its lower position. After that, the semiconductor wafer 10 is taken out from the wafer-introducing opening 84.

As described above, according to the seventh preferred embodiment, while the lower surface of the semiconductor wafer 10 is heated entirely by the hot plate 21, the upper surface of the wafer 10 is heated at its outer portions (peripheral edge) by the upper hot plate 90. The temperature of the semiconductor wafer 10 is higher at around the peripheral edge than around the center thereof. As a result, change rate of size of a resist pattern is made equally on the entire surface of the wafer 10; and therefore, ICs or LSIs formed on the wafer 10 can be fabricated with a higher reliability.

The upper hot plate 90 is applicable to the before described apparatus 1–6 according to the first to sixth preferred embodiments.

Eighth Preferred Embodiment

Figure 23:
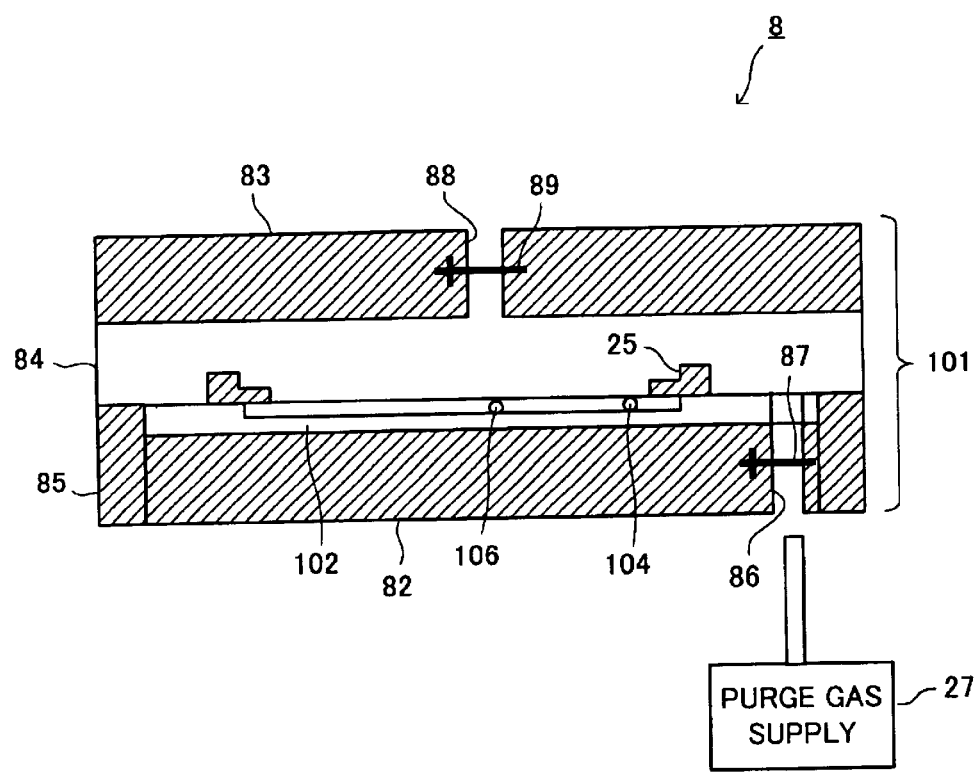
FIG. 23 is a cross-sectional view illustrating an apparatus for baking a semiconductor wafer according to an eighth preferred embodiment of the present invention.
Figure 24:
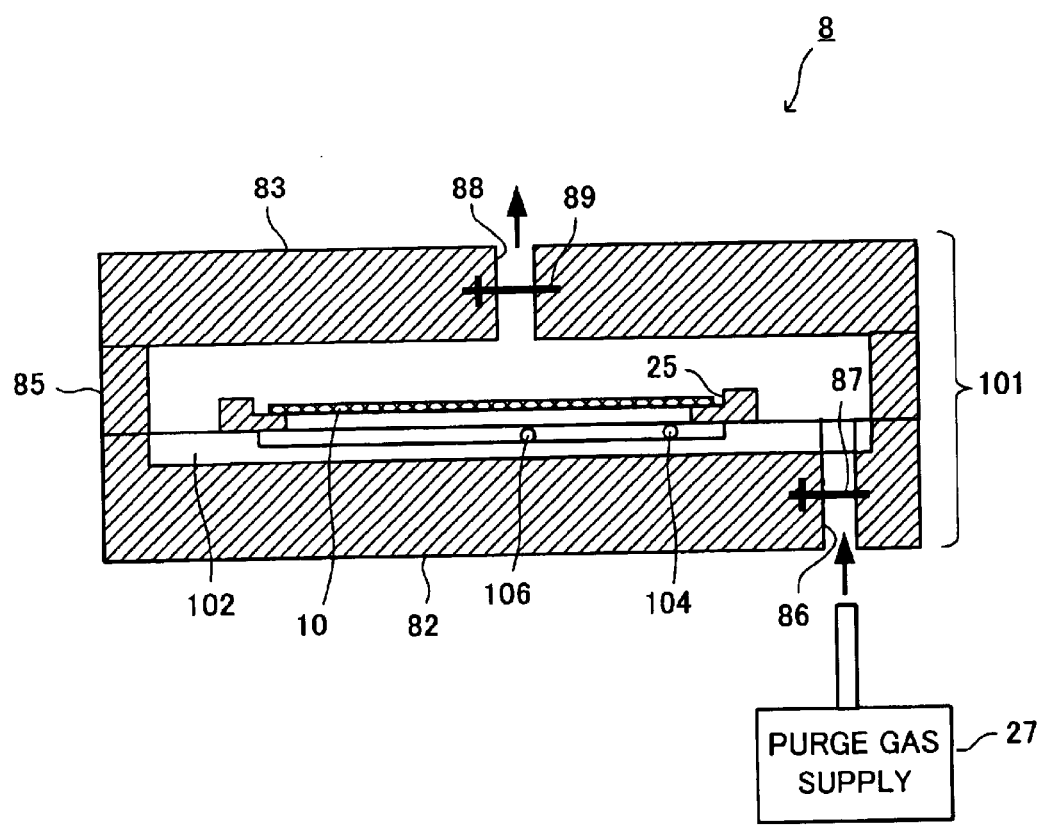
FIG. 24 is a cross-sectional view showing the apparatus in operation according to the eighth preferred embodiment, shown in FIG. 23.
Figure 25:
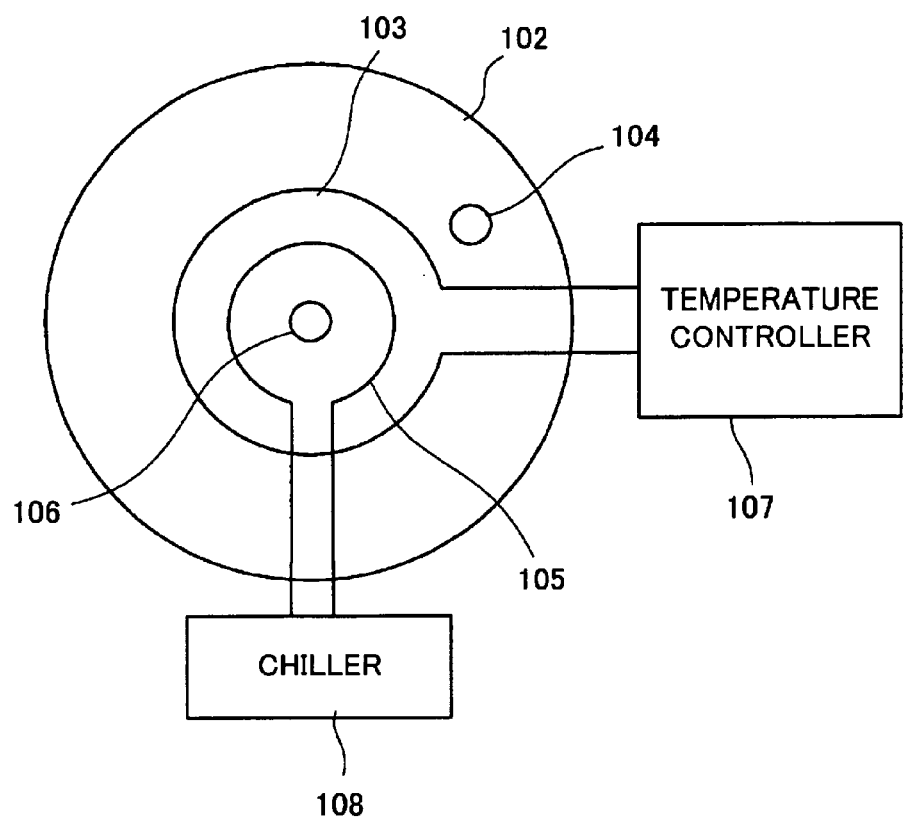
FIG. 25 is a diagram showing a lower hot plate used in the apparatus according to the eighth preferred embodiment, shown in FIG. 23.

FIG. 23 is a cross-sectional view showing an apparatus 8 for baking a semiconductor wafer having a resist pattern thereon, according to an eighth preferred embodiment of the present invention. FIG. 24 is a cross-sectional view showing the apparatus 8 in a baking process. FIG. 25 shows a hot plate used in the eighth preferred embodiment. In this embodiment, the same or corresponding elements to those in the first to seventh preferred embodiments are represented by the same reference numerals and the same description is not repeated.

As shown in FIGS. 23 and 24, the apparatus 8 includes a baking oven 101, in which a semiconductor wafer 10 having a resist pattern thereon is set. The baking oven 101 includes a lower cover 82 composing a lower portion of the baking oven 81 and an upper cover 83 composing an upper portion of the baking oven, and an inner-wall ring 85. The inner-wall ring 85 is designed to be able to rise and fall in order to open and close a wafer-introducing opening 84, which is arranged between the lower and upper covers 82 and 83. FIG. 23 shows the apparatus 8 in which the inner-wall ring 85 is at a lower position to open the wafer-introducing opening 84. FIG. 24 shows the apparatus 8 in which the inner-wall ring 85 is at a higher position to close the wafer-introducing opening 84.

As shown in FIGS. 23 and 24, the lower cover 82 is provided with a gas-introducing path 86, through which a purge gas is introduced into the baking oven 101. The gas-introducing path 86 is connected to a purge gas supply unit 27, which supplies a purge gas. The lower cover 82 is provided with valve 87 to open and close the gas-introducing path 86. The number, shape and arrangement of the gas-introducing path 86 are not limited by this embodiment as long as the purge gas is introduced into the baking oven 101.

The upper cover 83 is provided with a gas-exhaust path 88, through which a purge gas is exhausted out of the baking oven 101. The upper cover 83 is also provided with a valve 89 in the gas-exhaust path 88 to open and close the gas-exhaust path 88. The number, shape and arrangement of the gas-exhaust path 88 are not limited by this embodiment as long as the purge gas is exhausted out of the baking oven 101.

As shown in FIGS. 23 and 24, the apparatus 8 includes a hot plate 102 which heat a lower surface of the semiconductor wafer 10 entirely. The hot plate 21 includes a wafer heater 103, temperature sensors 104 and 106, and a cooling pipe 105, as shown in FIG. 25. The apparatus 8 also includes a temperature controller 107, which control a voltage applied to the wafer heater 103 in accordance with an output signal from the temperature sensor 104; and a chiller 108, which controls a temperature of coolant flowing in the cooling pipe 105 in accordance with a detection result of the temperature sensor 106. The hot plate 102 is provided with a wafer holder 25 to hold the semiconductor wafer 10 at a proper position.

Although in FIG. 25, the hot plate 102 is shaped to be round, the hot plate 102 may have other shapes as long as the hot plate 102 heats a lower surface of the semiconductor wafer 10 entirely. The temperature sensor 104 is arranged at an outer portion in the hot plate 102, however, the sensor 104 can be arranged at other positions. Further, a plurality of sensors 104 can be employed. For example, the temperature controller 107 may operate in response to the average value of detection results supplied from plural temperature sensors 104. As shown in FIG. 25, the cooling pipe 105 is shaped to be round. The cooling pipe 105 can be designed to have other shapes as long as the inner portion of the semiconductor wafer 10 is cooled. The temperature sensor 106 is arranged around the center of the hot plate 102, however, the sensor 106 can be arranged at other locations. Further, a plurality of sensors 106 can be employed. For example, the chiller 108 may operate in response to the average value of detection results supplied from plural temperature sensors 106.

In a baking treatment, the semiconductor wafer 10 is heated by the heater 103 provided in the hot plate 102. The hot plate 102 and heater 103 are shaped and made of a material so as to heat an entire lower surface of the semiconductor wafer 10 uniformly. On the semiconductor wafer 10, portions adjacent the center thereof is cooled by the cooling pipe 105. While the semiconductor wafer 10 is heated by the heater 103 and cooled by the cooling pipe 105, a purge gas (for example, $N_2$ gas) is introduced through the gas-introducing path 86 into the baking oven 101. The purge gas is exhausted through the gas-exhaust path 88. According to this embodiment, the semiconductor wafer 10 is cooled at its inner regions while a baking treatment is carried out, so that the semiconductor wafer 10 has a higher temperature at an outer region than the inner region. That is, a temperature gradient is provided to the semiconductor wafer 10 while a baking treatment. Preferably, the outer region of the semiconductor wafer 10 has a temperature 1–2° C. higher than the inner region.

When the baking treatment is completed, the valves 87 and 89 are closed and the inner-wall ring 85 is moved to its lower position. After that, the semiconductor wafer 10 is taken out from the wafer-introducing opening 84.

As described above, according to the eighth preferred embodiment, while the lower surface of the semiconductor wafer 10 is heated entirely by the heater 103, the inner portion adjacent the center of the wafer 10 is cooled by the cooling pipe 105. The temperature of the semiconductor wafer 10 is higher at around the peripheral edge than around the center thereof. As a result, change rate of size of a resist pattern is made equally on the entire surface of the wafer 10; and therefore, ICs or LSIs formed on the wafer 10 can be fabricated with a higher reliability.

The hot plate 102 is applicable to the before described apparatuses 1–7 according to the first to seventh embodiments.

Ninth Preferred Embodiment

Figure 26:
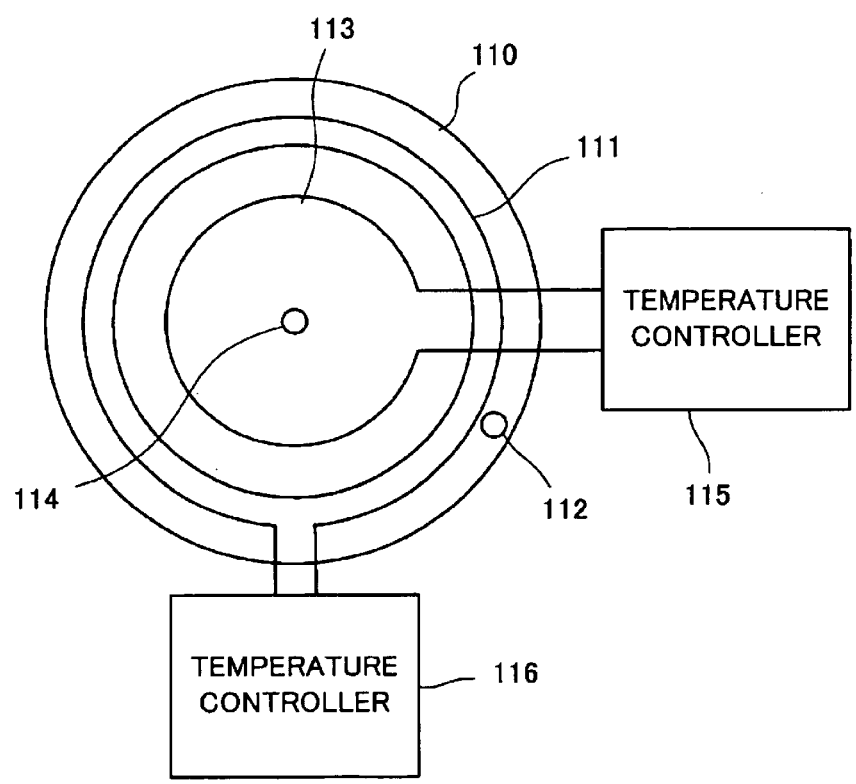
FIG. 26 is a diagram showing a lower hot plate according to a ninth preferred embodiment.

FIG. 26 shows a hot plate 110 used in a baking apparatus according to a ninth preferred embodiment of the present invention. The hot plate 110 is used in a baking apparatus 8, shown in FIG. 23, according to the eighth preferred embodiment.

The hot plate 110 includes a first wafer heater 111, a first temperature sensor 112, a second wafer heater 113 and a second temperature sensor 114. The first wafer heater 111 heats an outer region of a semiconductor wafer 10. The first sensor 112 detects a temperature at an outer region of the semiconductor wafer 10. The second wafer heater 113 heats an inner region of a semiconductor wafer 10. The second sensor 114 detects a temperature at an inner region of the semiconductor wafer 10. The outer region corresponds to a region adjacent the peripheral edge of the semiconductor wafer 10, while the inner region corresponds to a region adjacent the center of the semiconductor wafer.

The baking apparatus according to this embodiment includes a temperature controller 116, which controls a voltage level to be applied to the first wafer heater 111 in accordance with a detection result of the first temperature sensor 112. The baking apparatus further includes a temperature controller 115, which controls a voltage level to be applied to the second wafer heater 113 in accordance with a detection result of the second temperature sensor 114.

As described above, according to the ninth preferred embodiment, the hot plate 110 is divided into two parts of an outer region and an inner region, which are heated by the first and second heaters 111 and 113, respectively. The temperature of the inner region is controlled to be lower than the outer region. Preferably, the outer region of the semiconductor wafer 10 has a temperature 1–2° C. higher than the inner region.

In a baking treatment, the semiconductor wafer 10 is heated by the heaters 111 and 113 provided in the hot plate 110. The hot plate 110 and heaters 111 and 113 are shaped and made of a material so that the semiconductor wafer 10 has a higher temperature at an outer region adjacent the peripheral edge than at an inner region adjacent the center thereof. While the semiconductor wafer 10 is heated by the heaters 111 and 113, a purge gas (for example, $N_2$ gas) is introduced into a baking oven (101). The purge gas is exhausted through the gas-exhaust path 88. According to this embodiment, a temperature gradient is provided to the semiconductor wafer 10 while a baking treatment.

As described above, according to the ninth preferred embodiment, the hot plate 110 is controlled in temperature so that the inner region has a lower temperature than the outer region. Therefore, the temperature of the semiconductor wafer 10 is higher at around the peripheral edge than around the center thereof. As a result, change rate of size of a resist pattern is made equally on the entire surface of the wafer 10; and therefore, ICs or LSIs formed on the wafer 10 can be fabricated with a higher reliability.

The hot plate 110 is also applicable to the baking apparatuses 1–7, according to the first to seventh preferred embodiments. The hot plate 110 may includes three heaters or more so that the hot plate 110 is controlled in temperature for each of three or more different regions independently.

Tenth Preferred Embodiment

Figure 27:
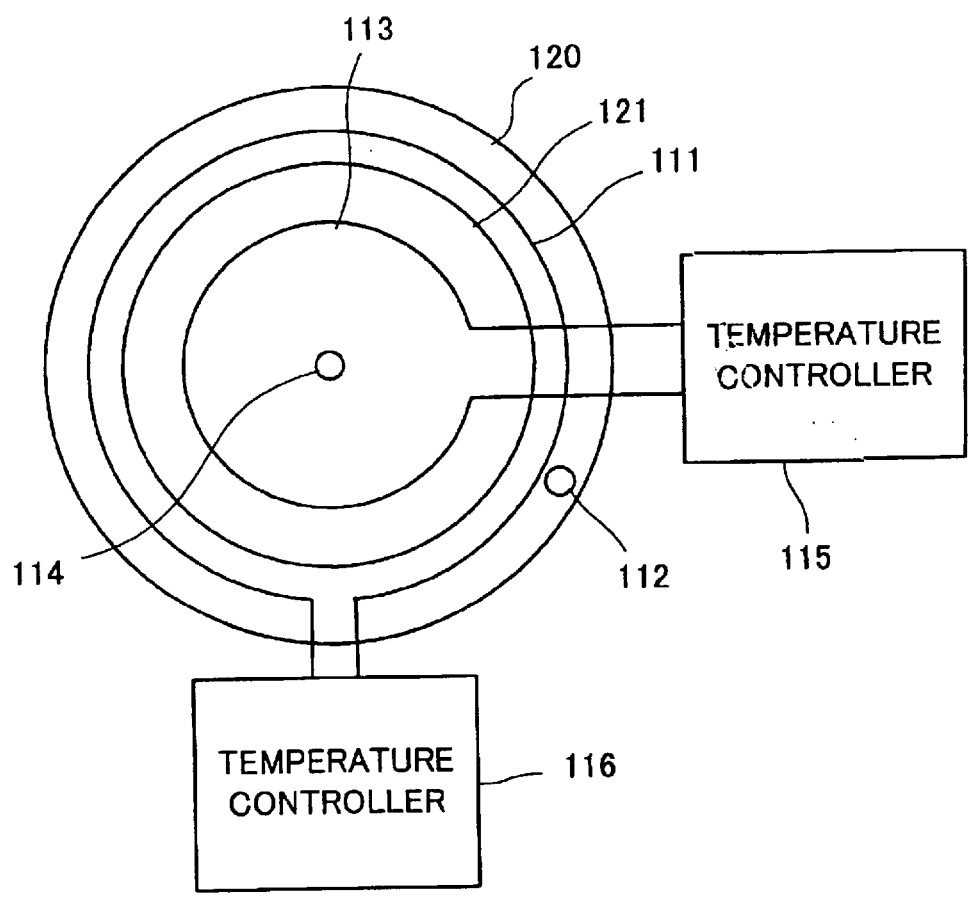
FIG. 27 is a diagram showing a lower hot plate according to a tenth preferred embodiment.

FIG. 27 shows a hot plate 120 used in a baking apparatus according to a ninth preferred embodiment of the present invention. The hot plate 120 is used in a baking apparatus 8, shown in FIG. 23, according to the eighth preferred embodiment. In this embodiment, the same or corresponding elements to those in the ninth preferred embodiment are represented by the same reference numerals and the same description is not repeated.

The hot plate 120 includes a first wafer heater 111, a first temperature sensor 112, a second wafer heater 113 and a second temperature sensor 114. The first wafer heater 111 heats an outer region of a semiconductor wafer 10. The first sensor 112 detects a temperature at an outer region of the semiconductor wafer 10. The second wafer heater 113 heats an inner region of a semiconductor wafer 10. The second sensor 114 detects a temperature at an inner region of the semiconductor wafer 10. The outer region corresponds to a region adjacent the peripheral edge of the semiconductor wafer 10, while the inner region corresponds to a region adjacent the center of the semiconductor wafer.

The hot plate 120 also includes a heat insulating material 121, which is arranged between the first and second heaters 111 and 113. The baking apparatus according to this embodiment includes a temperature controller 116, which controls a voltage level to be applied to the first wafer heater 111 in accordance with a detection result of the first temperature sensor 112. The baking apparatus further includes a temperature controller 115, which controls a voltage level to be applied to the second wafer heater 113 in accordance with a detection result of the second temperature sensor 114.

As described above, according to the tenth preferred embodiment, the hot plate 110 is divided into two parts of an outer region and an inner region, which are heated by the first and second heaters 111 and 113, respectively. The temperature of the inner region is controlled to be lower than the outer region. Preferably, the outer region of the semiconductor wafer 10 has a temperature 1–2° C. higher than the inner region.

Eleventh Preferred Embodiment

Figure 28:
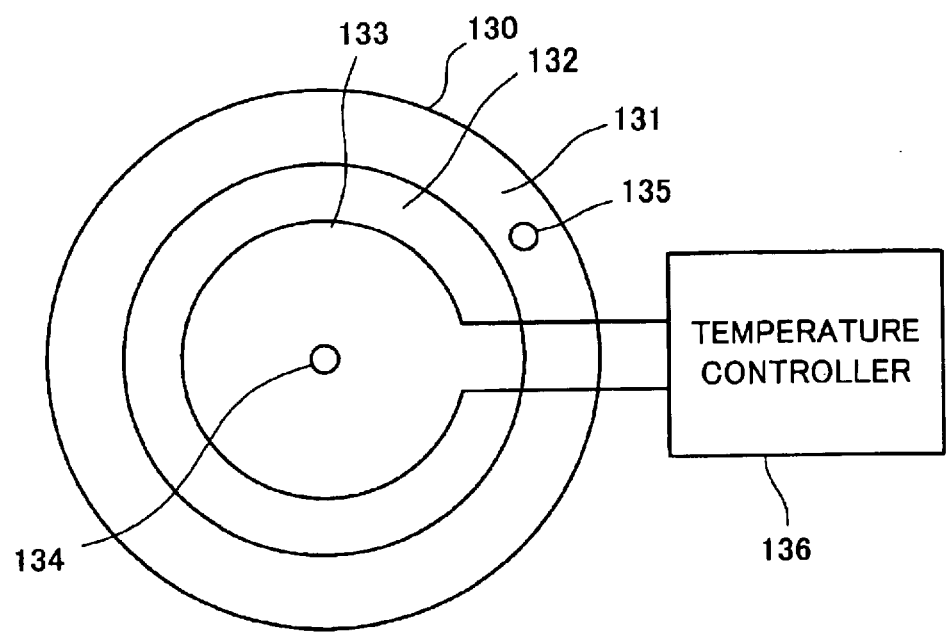
FIG. 28 is a diagram showing a lower hot plate according to an eleventh preferred embodiment.

FIG. 28 shows a hot plate 130 used in a baking apparatus according to an eleventh preferred embodiment of the present invention. The hot plate 130 is used in a baking apparatus 8, shown in 23, according to the eighth preferred embodiment. In this embodiment, the same or corresponding elements to those in the ninth and tenth preferred embodiments are represented by the same reference numerals and the same description is not repeated.

The hot plate 130 includes a first portion 131 and a second portion 132, which form an outer region and an inner region of the hot plate 130, respectively. The first portion 131 is made of a material having a higher heat conductivity than the second portion 132. The hot plate 130 also includes a wafer heater 133, a first temperature sensor 135, and a second temperature sensor 134. The wafer heater 133 heats an upper surface of the hot plate 130 entirely and uniformly. The first sensor 135 is arranged at the first portion 131 to detect a temperature thereat. The second sensor 134 detects a temperature at an inner region of the semiconductor wafer 10.

According to this embodiment, the outer portion 131 of the hot plate 120 has a higher heat conductivity, so that the our region of the hot plate 120 and a region adjacent the peripheral edge of the semiconductor wafer is heated at a higher temperature than the inner portion 133.

As described above, according to the eleventh preferred embodiment, the hot plate 130 is controlled in temperature so that the inner region has a lower temperature than the outer region. Therefore, the temperature of the semiconductor wafer 10 is higher at around the peripheral edge than around the center thereof. As a result, change rate of size of a resist pattern is made equally on the entire surface of the wafer 10; and therefore, ICs or LSIs formed on the wafer 10 can be fabricated with a higher reliability.

According to the eleventh preferred embodiment, the hot plate 130 is divided into two parts of an outer region and an inner region, which are made of materials having different heat conductivities. The hot plate 130 can be formed with three parts that are made of materials having different heat conductivities. The parts 131 and 132 may be designed to be exchangeable from the hot plate 130. The hot plate 130 is applicable to the baking apparatuses 1–7 according to the first to seventh preferred embodiments.

Twelfth Preferred Embodiment

Figure 29:
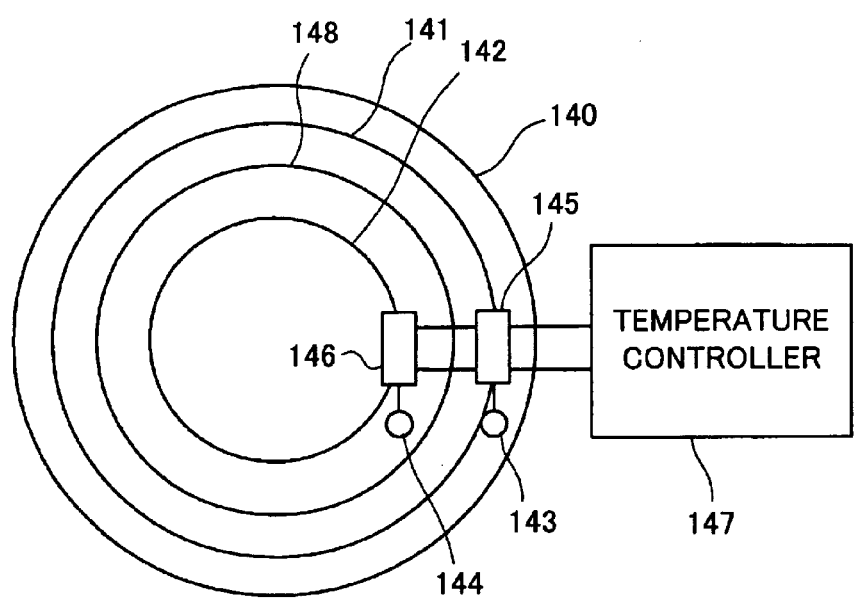
FIG. 29 is a diagram showing a lower hot plate according to a twelfth preferred embodiment.

FIG. 29 shows a hot plate 140 used in a baking apparatus according to a twelfth preferred embodiment of the present invention. The hot plate 140 is used in a baking apparatus 8, shown in 23, according to the eighth preferred embodiment. In this embodiment, the same or corresponding elements to those in the ninth to eleventh preferred embodiments are represented by the same reference numerals and the same description is not repeated.

The hot plate 140 includes a first wafer heater 141, a first temperature sensor 143, a second wafer heater 142 and a second temperature sensor 144. The first wafer heater 141 heats an outer region of a semiconductor wafer 10. The first sensor 143 detects a temperature at an outer region of the hot plate 140 facing a region adjacent the peripheral edge of the semiconductor wafer 10. The second wafer heater 142 heats an inner region of a semiconductor wafer 10. The second sensor 144 detects a temperature at an inner region of the hot plate 140 facing a region adjacent the center of the semiconductor wafer 10.

The baking apparatus according to this embodiment includes a first variable transformer 145, a second variable transformer 146 and a temperature controller 147. The first variable transformer 145 controls a voltage to be applied to the first wafer heater 141. The second variable transformer 146 controls a voltage to be applied to the second wafer heater 142. The temperature controller 147 is connected to the first and second variable transformers 145 and 146. The temperature controller 147 controls output voltage levels of the first and second variable transformer 145 and 146 in response to detection results of the first and second sensors 143 and 144, respectively. A heat insulating material 148 may be provided between the first and second heaters 141 and 142, as shown in FIG. 29.

As described above, according to the twelfth preferred embodiment, the hot plate 140 is divided into two parts of an outer region and an inner region, which are heated by the first and second heaters 141 and 142, respectively. The temperature of the inner region is controlled to be lower than the outer region. Preferably, the outer region of the semiconductor wafer 10 has a temperature 1–2° C. higher than the inner region.

As described above, according to the twelfth preferred embodiment, the hot plate 140 is controlled in temperature so that the inner region has a lower temperature than the outer region. Therefore, the temperature of the semiconductor wafer 10 is higher at around the peripheral edge than around the center thereof. As a result, change rate of size of a resist pattern is made equally on the entire surface of the wafer 10; and therefore, ICs or LSIs formed on the wafer 10 can be fabricated with a higher reliability.

According to the twelfth preferred embodiment, the hot plate 140 is divided into two parts of an outer region and an inner region, which are heated by the different heaters 141 and 142, respectively. The hot plate 140 can be formed with three parts that are heated by different heaters independently. The hot plate 140 is applicable to the baking apparatuses 1–7 according to the first to seventh preferred embodiments. In addition, upper and lower hot plates may be controlled by a single controller to have different temperatures.

Thirteenth Preferred Embodiment

Figure 30:
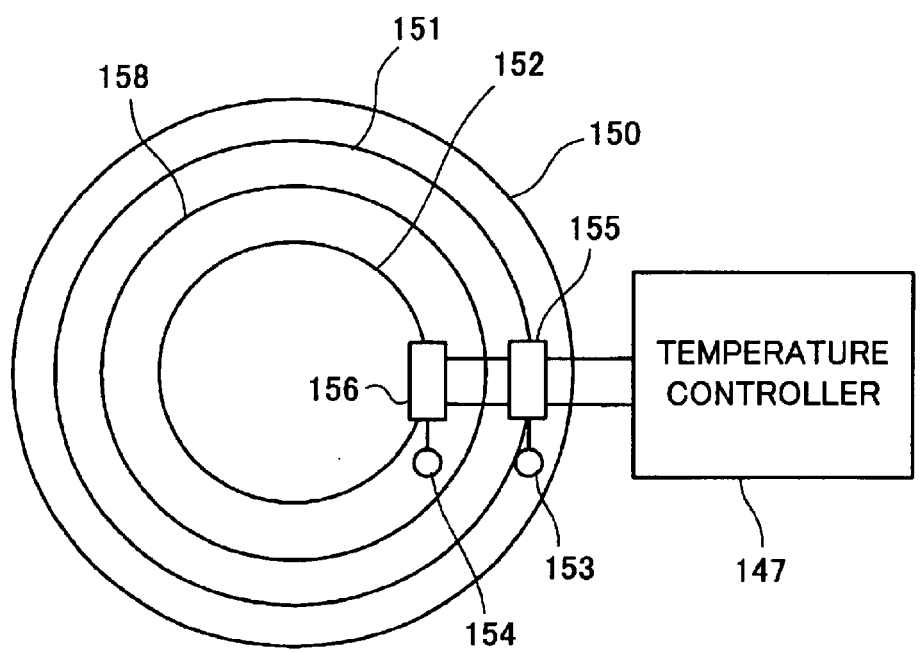
FIG. 30 is a diagram showing a lower hot plate according to a thirteenth preferred embodiment.

FIG. 30 shows a hot plate 150 used in a baking apparatus according to a thirteenth preferred embodiment of the present invention. The hot plate 150 is used in a baking apparatus 8, shown in 23, according to the eighth preferred embodiment. In this embodiment, the same or corresponding elements to those in the ninth to twelfth preferred embodiments are represented by the same reference numerals and the same description is not repeated.

The hot plate 150 includes a first wafer heater 151, a first temperature sensor 153, a second wafer heater 152 and a second temperature sensor 154. The first wafer heater 151 heats an outer region of a semiconductor wafer 10. The first sensor 153 detects a temperature at an outer region of the hot plate 150 facing a region adjacent the peripheral edge of the semiconductor wafer 10. The second wafer heater 152 heats an inner region of a semiconductor wafer 10. The second sensor 154 detects a temperature at an inner region of the hot plate 150 facing a region adjacent the center of the semiconductor wafer 10.

The baking apparatus according to this embodiment includes a first switching device 155, a second switching device 156 and a temperature controller 147. The first switching device 145 turns on and off to control supply of a voltage signal to the first wafer heater 151. The second switching device 146 turns on and off to control supply of a voltage signal to the second wafer heater 151. The temperature controller 147 is connected to the first and second switching devices 155 and 156. The temperature controller 147 controls the switches 155 and 156 in accordance with detection results of the first and second sensors 153 and 154, respectively. A heat insulating material 158 may be provided between the first and second heaters 151 and 152, as shown in FIG. 30.

As described above, according to the thirteenth preferred embodiment, the hot plate 150 is divided into two parts of an outer region and an inner region, which are heated by the first and second heaters 151 and 152, respectively. The temperature of the inner region is controlled to be lower than the outer region. Preferably, the outer region of the semiconductor wafer 10 has a temperature 1–2° C. higher than the inner region.

As described above, according to the thirteenth preferred embodiment, the hot plate 150 is controlled in temperature so that the inner region has a lower temperature than the outer region. Therefore, the temperature of the semiconductor wafer 10 is higher at around the peripheral edge than around the center thereof. As a result, change rate of size of a resist pattern is made equally on the entire surface of the wafer 10; and therefore, ICs or LSIs formed on the wafer 10 can be fabricated with a higher reliability.

The hot plate 150 can be formed with three parts that are heated by different heaters independently. The hot plate 150 is applicable to the baking apparatuses 1–7 according to the first to seventh preferred embodiments. In addition, upper and lower hot plates may be controlled by a single controller to have different temperatures, in the same manner as the seventh preferred embodiment.

Some of the above-described embodiments can be combined to form other types of baking apparatuses.

What is claimed is:

1. An apparatus for baking a semiconductor wafer having a resist pattern thereon, comprising:

a baking oven in which the semiconductor wafer is placed and heated;

a first hot plate which is provided in the baking oven to heat an entire bottom surface of the semiconductor wafer;

a temperature sensor located adjacent to said first hot plate;

a gas supply unit which comprises a gas introducing path, through which the purge gas is introduced into the baking oven, and a gas exhaust path, through which the purge gas is exhausted out of the baking oven; and a gas temperature controller which controls a temperature of the purge gas in accordance with an output of the temperature sensor, in order that the purge gas flowing around a peripheral edge or outer portion of the wafer has a higher temperature than that flowing around the center or inner portion of the wafer.

2. An apparatus according to claim 1, wherein the gas introducing path is arranged adjacent the center of the semiconductor wafer, the gas exhaust path is arranged adjacent the peripheral edge of the semiconductor wafer, and the gas temperature controller comprises a gas cooler arranged adjacent the gas introducing path to cool the purge gas to be introduced into the baking oven.

3. An apparatus according to claim 1, further comprising:
a second hot plate which heats a region adjacent the peripheral edge of an upper surface of the semiconductor wafer.

4. An apparatus according to claim 2, wherein said temperature sensor is located adjacent to a center of said first hot plate.

5. An apparatus according to claim 2, wherein said temperature sensor is located at a center of said first hot plate.

6. An apparatus according to claim 1, wherein said temperature sensor is located adjacent to a center of said first hot plate.

7. An apparatus according to claim 1, wherein said temperature sensor is located at a center of said first hot plate.

8. A method for baking a semiconductor wafer having a resist pattern thereon, comprising:
setting the semiconductor wafer in a baking oven;
heating an entire bottom surface of the semiconductor wafer using a first hot plate;
detecting and outputting a temperature value with a temperature sensor located adjacent to said first hot plate;
supplying a purge gas onto an upper surface of the semiconductor wafer; and
controlling a temperature of the purge gas according to the temperature value output of the temperature sensor, in order that the purge gas flowing around a peripheral edge of the semiconductor wafer has a higher temperature than that flowing around the center of the wafer.

9. A method according to claim 8, wherein
the purge gas is introduced from a portion adjacent the center of the semiconductor wafer,
the purge gas is exhausted from a portion adjacent the peripheral edge of the semiconductor wafer, and
the purge gas is cooled before being introducing into the baking oven.

10. A method according to claim 8, further comprising:
heating a region adjacent the peripheral edge of an upper surface of the semiconductor wafer.

11. A method according to claim 9, wherein said step of detecting and outputting a temperature value with a temperature sensor includes positioning the temperature sensor adjacent to a center of the first hot plate.

12. A method according to claim 9, wherein said step of detecting and outputting a temperature value with a temperature sensor includes positioning the temperature sensor at a center of the first hot plate.

13. A method according to claim 8, wherein said step of detecting and outputting a temperature value with a temperature sensor includes positioning the temperature sensor adjacent to a center of the first hot plate.

14. A method according to claim 8, wherein said step of detecting and outputting a temperature value with a temperature sensor includes positioning the temperature sensor at a center of the first hot plate.

15. An apparatus for baking a semiconductor wafer having a resist pattern thereon, comprising:
a baking oven in which the semiconductor wafer is placed and heated;
a first hot plate which is provided in the baking oven to heat an entire bottom surface of the semiconductor wafer;
a temperature sensor located in the baking oven;
a gas supply unit which comprises a gas introducing path, through which the purge gas is introduced into the baking oven, and a gas exhaust path, through which the purge gas is exhausted out of the baking oven; and
a gas temperature controller, the temperature sensor being positioned in the baking oven and the gas temperature controller controlling a temperature of the purge gas in accordance with an output of the temperature sensor, such that the purge gas flowing around a peripheral edge or outer portion of the wafer has a higher temperature than that flowing around the center or inner portion of the wafer.

16. An apparatus according to claim 15, wherein the temperature sensor is positioned in relation to the first hot plate and the controller controlling the temperature of the purge gas according to the temperature value output of the temperature sensor, such that the purge gas flowing around a peripheral edge of the semiconductor wafer has a higher temperature than that flowing around the center of the wafer.

17. A method for baking a semiconductor wafer having a resist pattern thereon, comprising:
setting the semiconductor wafer in a baking oven;
heating an entire bottom surface of the semiconductor wafer using a first hot plate;
detecting and outputting a temperature value with a located adjacent to said first hot plate;
supplying a purge gas onto an upper surface of the semiconductor wafer; and
positioning a temperature sensor in the baking oven and controlling a temperature of the purge gas according to a temperature value output of the temperature sensor, such that the purge gas flowing around a peripheral edge of the semiconductor wafer has a higher temperature than that flowing around the center of the wafer.

18. A method according to claim 17, wherein said positioning and controlling includes positioning the temperature sensor in relation to the first hot plate and controlling the temperature of the purge gas according to a temperature value output of the temperature sensor, such that the purge gas flowing around a peripheral edge of the semiconductor wafer has a higher temperature than that flowing around the center of the wafer.

* * * * *